(12) United States Patent
Lee

(10) Patent No.: US 7,632,738 B2
(45) Date of Patent: Dec. 15, 2009

(54) WAFER BONDING METHOD

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 0 days.

(21) Appl. No.: 12/345,503

(22) Filed: Dec. 29, 2008

(65) Prior Publication Data

US 2009/0111241 A1    Apr. 30, 2009

Related U.S. Application Data

(63) Continuation-in-part of application No. 11/092,498, filed on Mar. 29, 2005, now Pat. No. 7,470,142, which is a continuation-in-part of application No. 10/873,969, filed on Jun. 21, 2004, now Pat. No. 7,052,941.

(30) Foreign Application Priority Data

Jun. 24, 2003  (KR) ............. 10 2003 0040920
Jul. 12, 2003  (KR) ............. 10 2003 0047515

(51) Int. Cl.
    *H01L 21/30* (2006.01)
(52) U.S. Cl. ............... 438/455; 257/E21.122
(58) Field of Classification Search ........ 438/455, 438/406; 257/E21.122
    See application file for complete search history.

(56) References Cited

U.S. PATENT DOCUMENTS

| | | | |
|---|---|---|---|
| 4,704,785 A | 11/1987 | Curran | |
| 4,829,018 A | 5/1989 | Wahlstrom | |
| 4,939,568 A | 7/1990 | Kato et al. | |
| 5,087,585 A | 2/1992 | Hayashi | |
| 5,093,704 A | 3/1992 | Saito et al. | |
| 5,106,775 A | 4/1992 | Kaga et al. | |
| 5,152,857 A | 10/1992 | Ito et al. | |
| 5,266,511 A | 11/1993 | Takao | |
| 5,308,782 A | 5/1994 | Mazure et al. | |
| 5,355,022 A | 10/1994 | Sugahara et al. | |
| 5,554,870 A | 9/1996 | Fitch et al. | |
| 5,627,106 A | 5/1997 | Hsu | |
| 5,695,557 A | 12/1997 | Yamagata et al. | |
| 5,835,396 A | 11/1998 | Zhang | |
| 5,892,225 A | 4/1999 | Okihara | |
| 5,915,167 A | 6/1999 | Leedy | |
| 5,977,579 A | 11/1999 | Noble | |
| 5,980,633 A | 11/1999 | Yamagata et al. | |
| 5,998,808 A | 12/1999 | Matsushita | |
| 6,153,495 A | 11/2000 | Kub et al. | |
| 6,222,251 B1 | 4/2001 | Holloway | |
| 6,229,161 B1 | 5/2001 | Nemati et al. | |
| 6,331,468 B1 | 12/2001 | Aronowitz et al. | |
| 6,531,697 B1 | 3/2003 | Nakamura et al. | |
| 6,534,382 B1* | 3/2003 | Sakaguchi et al. ........ 438/455 |
| 6,600,173 B2* | 7/2003 | Tiwari ................. 257/74 |
| 6,630,713 B2 | 10/2003 | Geusic | |
| 6,677,204 B2 | 1/2004 | Cleeves et al. | |

(Continued)

*Primary Examiner*—Thao P. Le
(74) *Attorney, Agent, or Firm*—Schmeiser Olsen & Watts LLP

(57) ABSTRACT

A method includes steps of providing first and second substrates, and forming a bonding interface between them using a conductive bonding region. A portion of the second substrate is removed to form a mesa structure. A vertically oriented semiconductor device is formed with the mesa structure. A portion of the conductive bonding region is removed to form a contact. The vertically oriented semiconductor device is carried by the contact.

5 Claims, 19 Drawing Sheets

U.S. PATENT DOCUMENTS

| | | | |
|---|---|---|---|
| 6,822,233 B2 | 11/2004 | Nakamura et al. | |
| 6,943,067 B2 | 9/2005 | Greenlaw | |
| 6,943,407 B2 | 9/2005 | Ouyang et al. | |
| 6,995,430 B2 * | 2/2006 | Langdo et al. | 257/352 |
| 7,002,152 B2 | 2/2006 | Grunewald | |
| 7,052,941 B2 | 5/2006 | Lee | |
| 7,078,739 B1 | 7/2006 | Nemati et al. | |
| 7,470,142 B2 * | 12/2008 | Lee | 439/406 |
| 7,470,598 B2 * | 12/2008 | Lee | 438/455 |
| 2002/0024140 A1 | 2/2002 | Nakajima et al. | |
| 2002/0025604 A1 | 2/2002 | Tiwari | |
| 2002/0141233 A1 | 10/2002 | Hosotani et al. | |
| 2003/0067043 A1 | 4/2003 | Zhang | |
| 2003/0113963 A1 | 6/2003 | Wurzer | |
| 2003/0139011 A1 | 7/2003 | Cleeves et al. | |
| 2004/0113207 A1 | 6/2004 | Hsu et al. | |
| 2004/0155301 A1 | 8/2004 | Zhang | |
| 2004/0160849 A1 | 8/2004 | Rinerson et al. | |
| 2005/0095835 A1 * | 5/2005 | Humpston et al. | 438/613 |
| 2006/0046432 A1 * | 3/2006 | Sankarapillai et al. | 438/458 |
| 2006/0252229 A1 * | 11/2006 | Joly et al. | 438/455 |
| 2007/0072391 A1 * | 3/2007 | Pocas et al. | 438/455 |

* cited by examiner

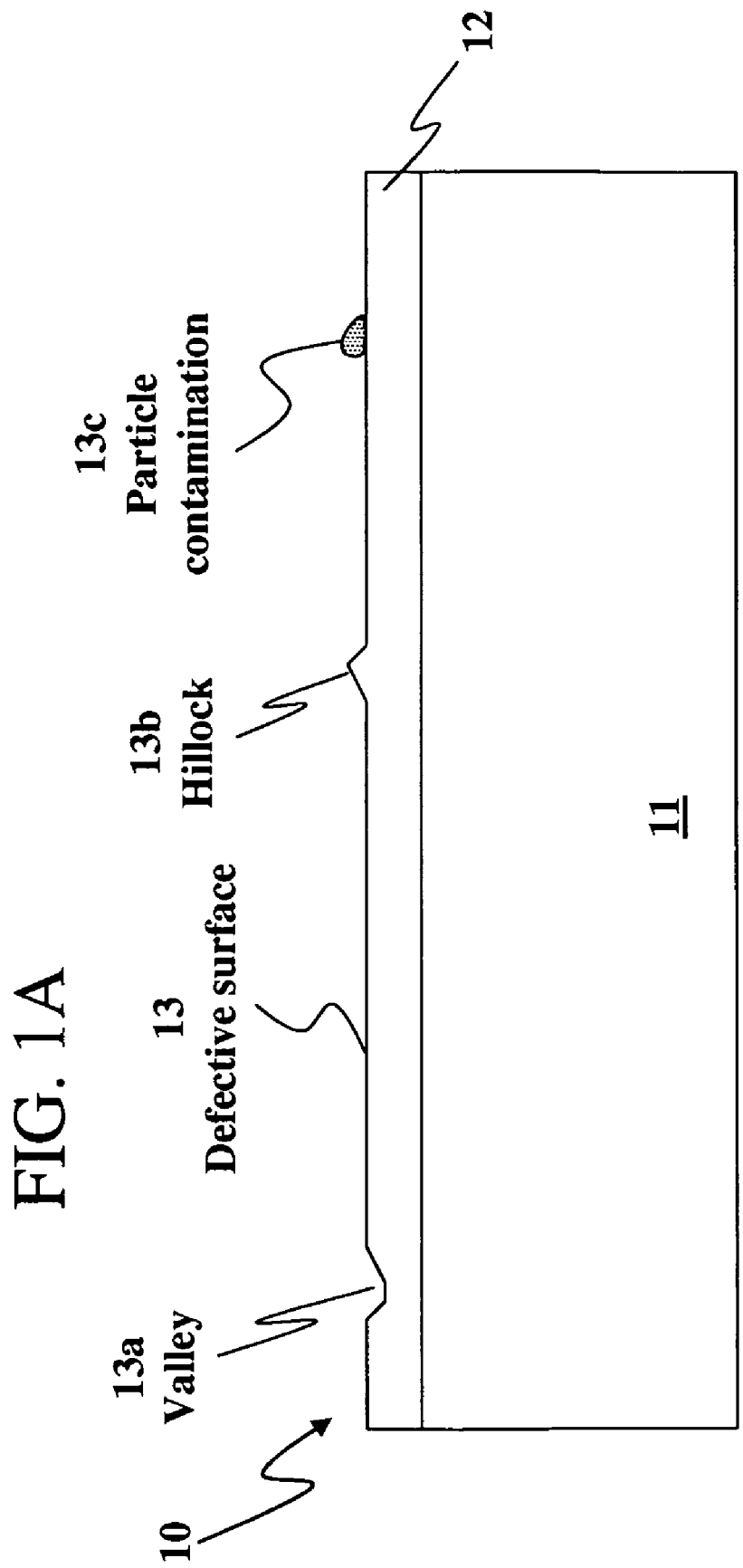

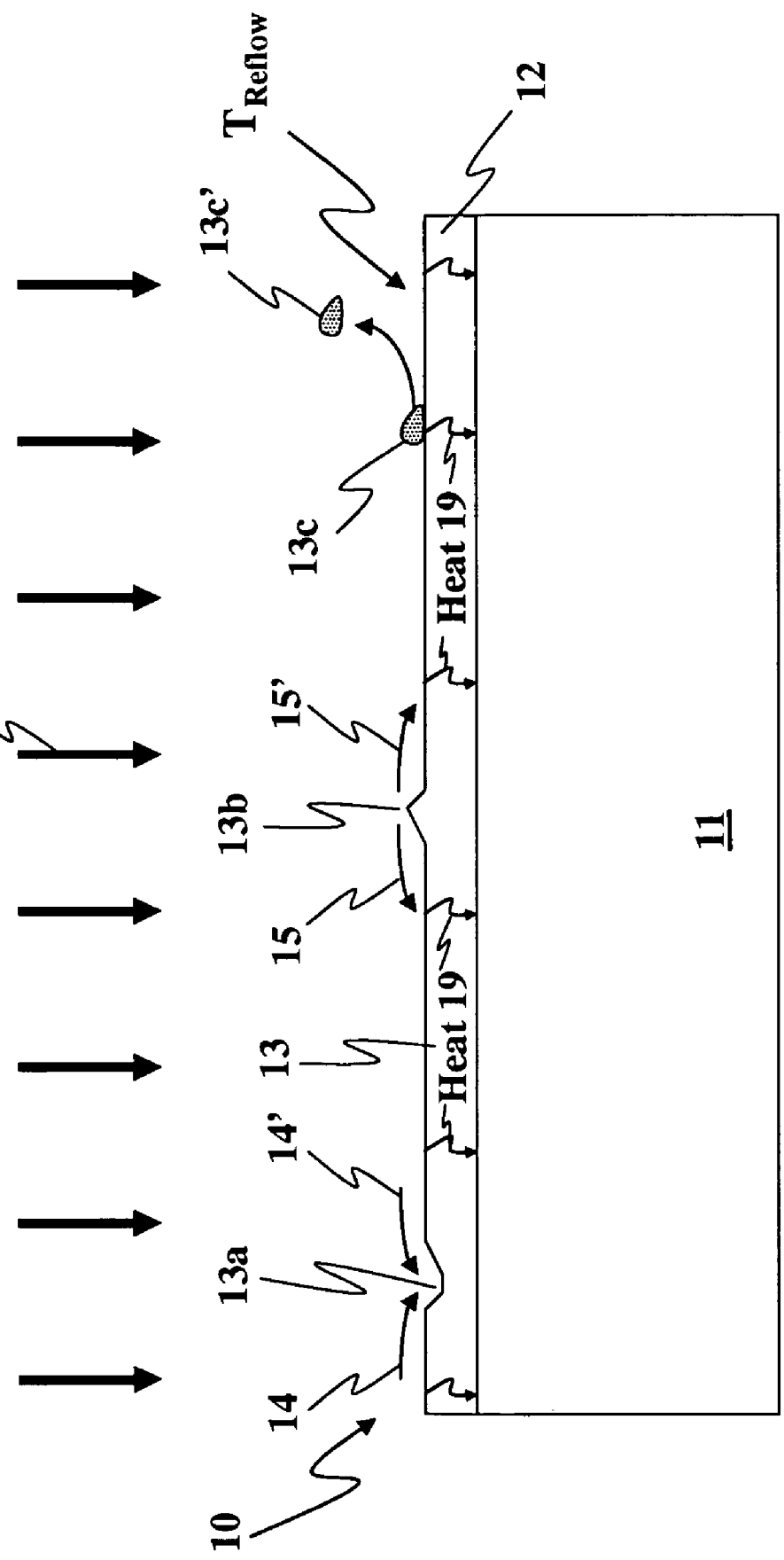

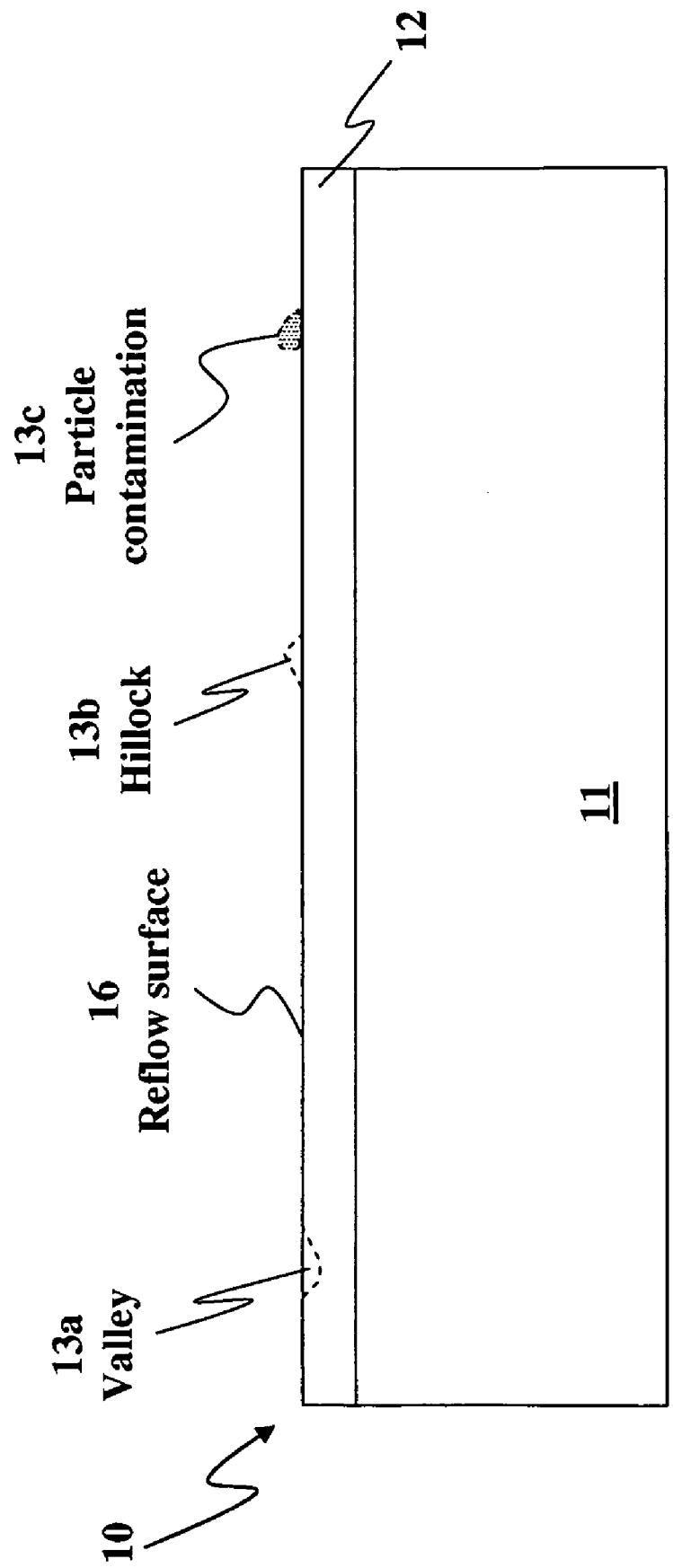

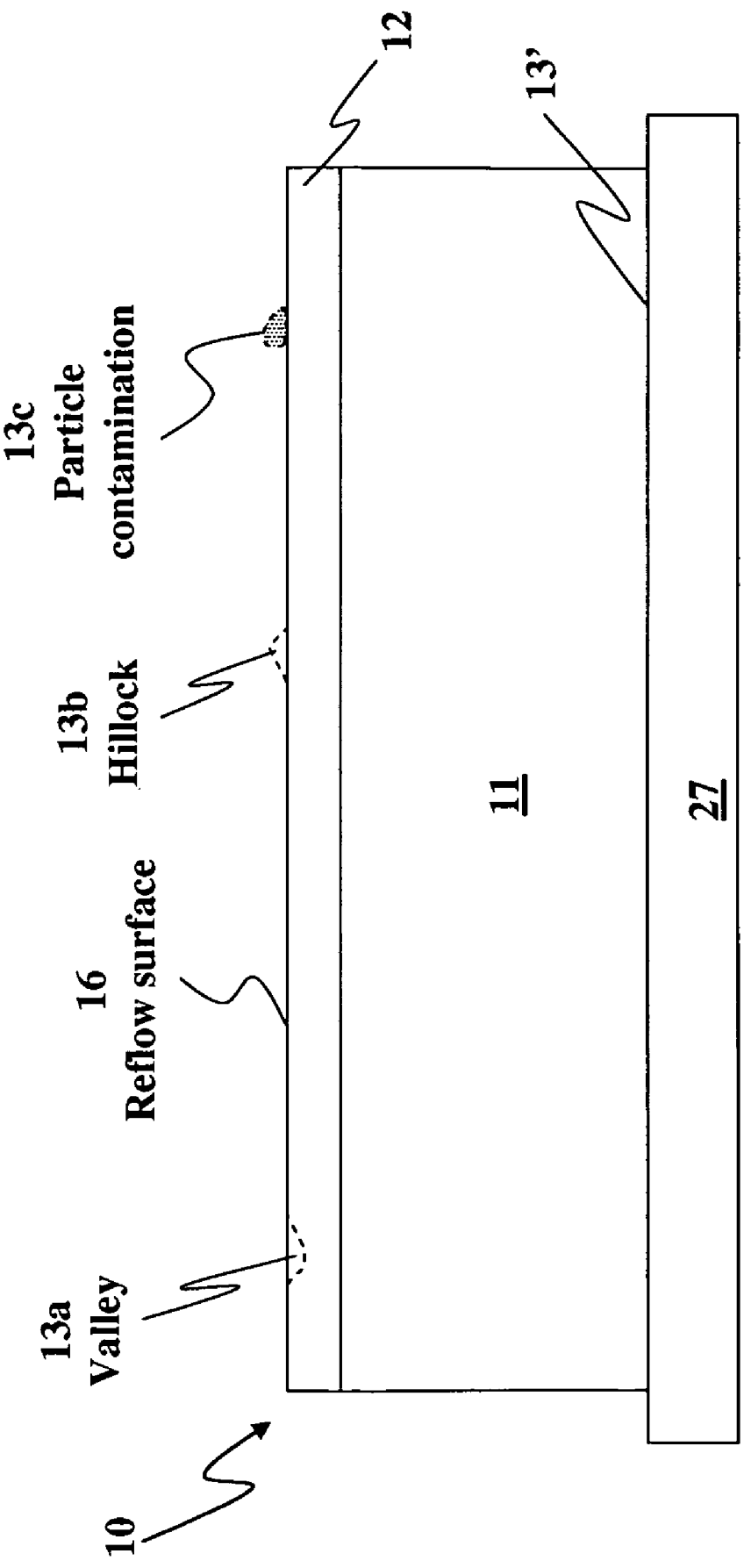

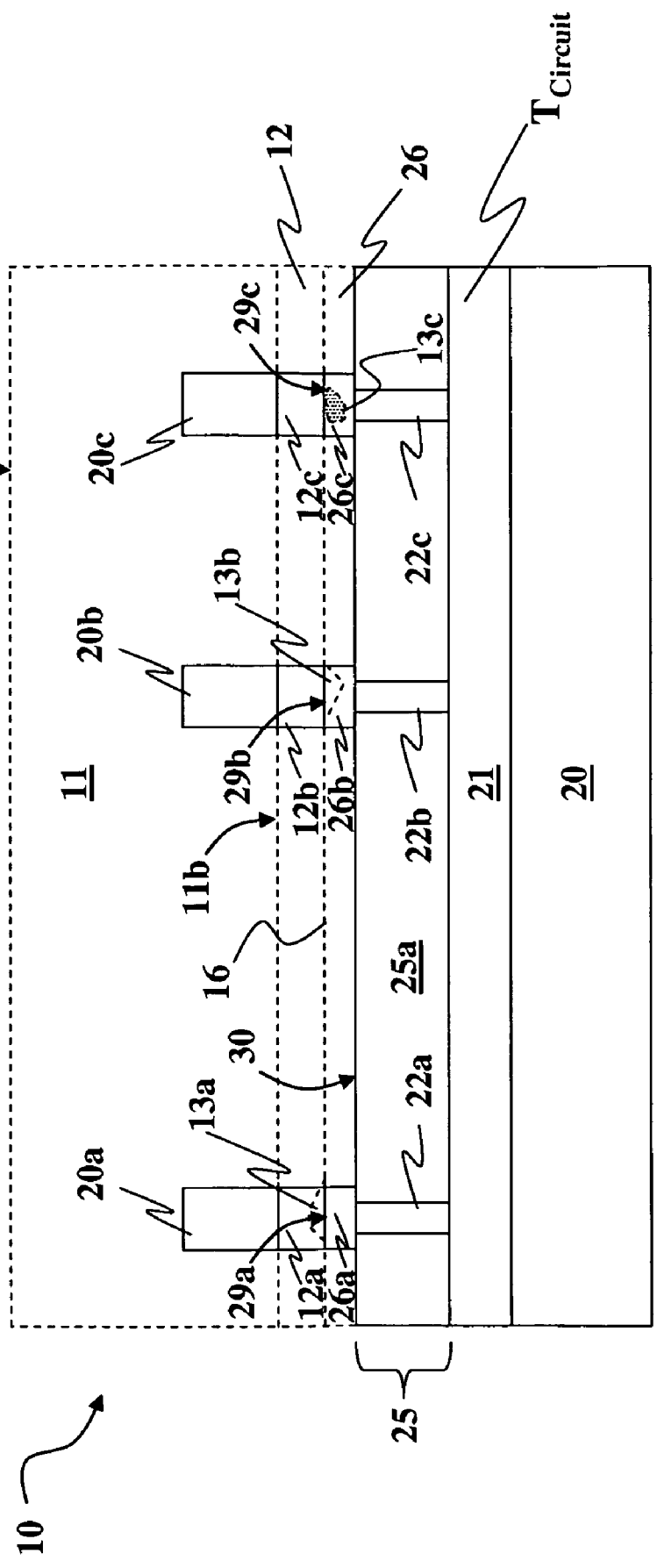

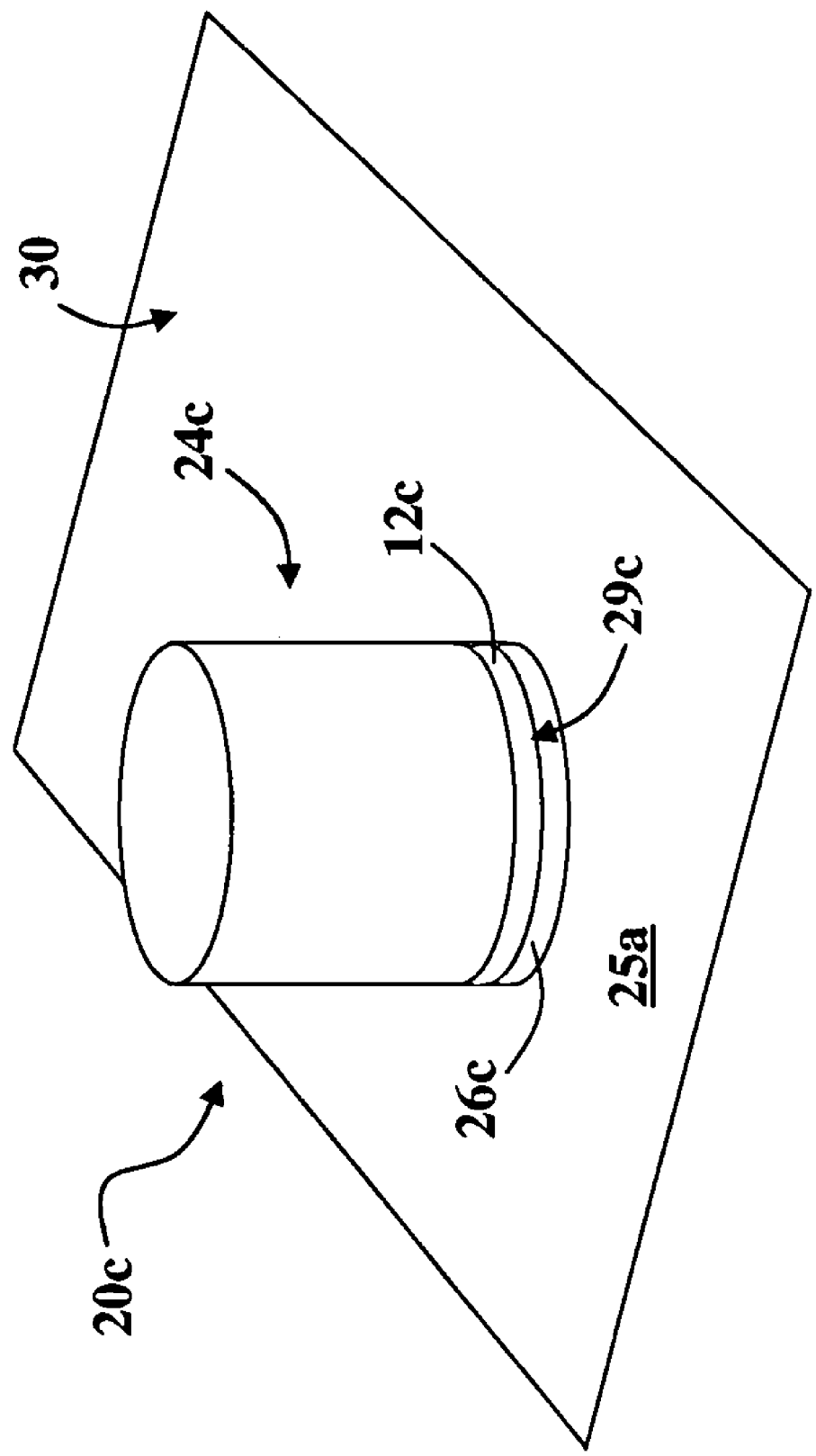

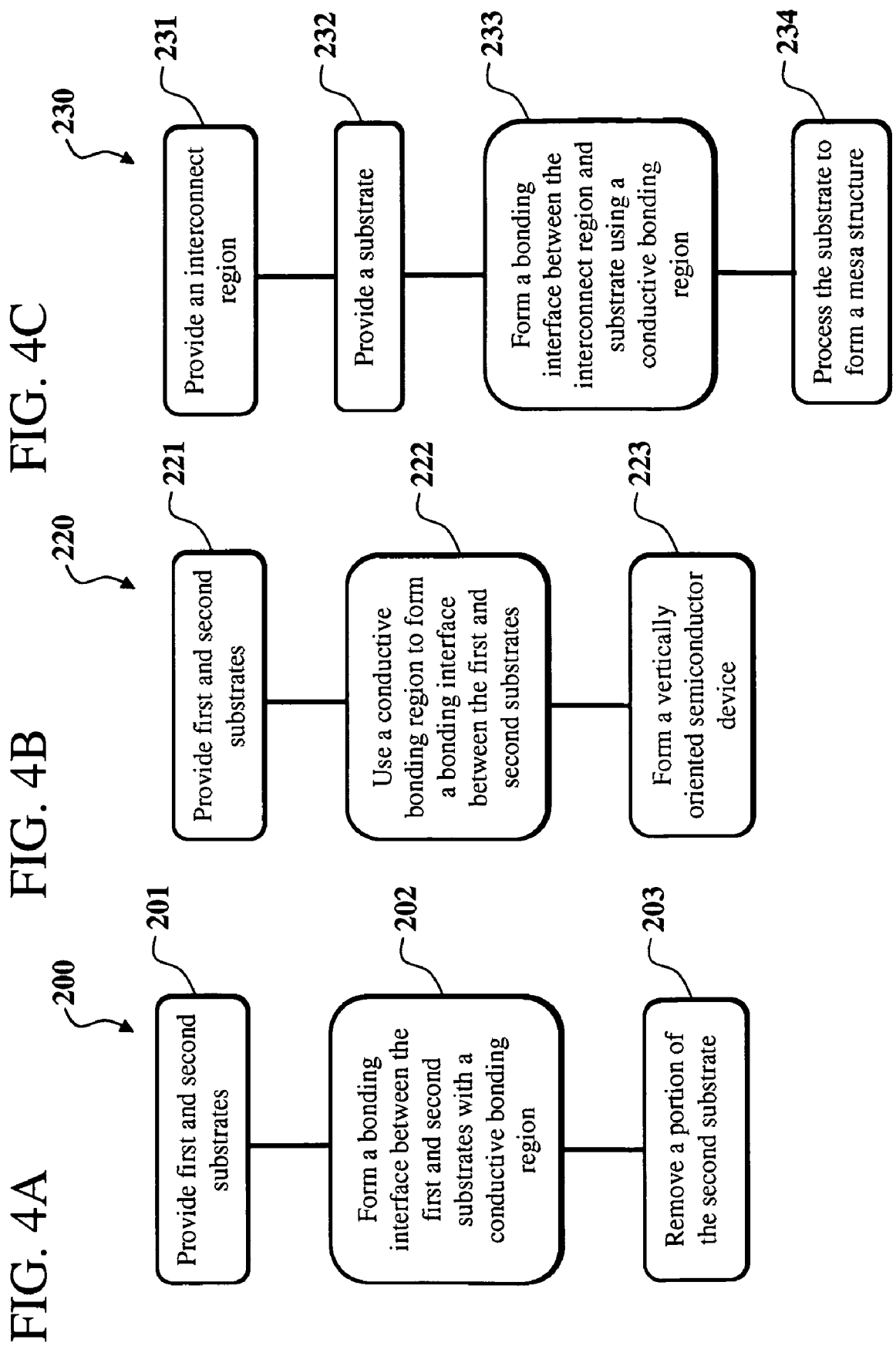

WAFER BONDING METHOD

CROSS-REFERENCE TO RELATED APPLICATIONS

This application is a continuation-in-part of U.S. patent application Ser. No. 11/092,498, filed on Mar. 29, 2005, now U.S. Pat. No. 7,470,142, which in turn is a continuation-in-part of U.S. application Ser. No. 10/873,969, filed on Jun. 21, 2004, now U.S. Pat. No. 7,052,941, and claims the benefit of both prior applications.

This application also claims benefit to prior U.S. patent application Ser. No. 11/092,521 filed on Mar. 29, 2005, Ser. No. 11/092,501 filed on Mar. 29, 2005, Ser. No. 11/092,500 filed on Mar. 29, 2005, Ser. No. 11/092,499 filed on Mar. 29, 2005, now U.S. Pat. No. 7,470,598, Ser. No. 11/180,286 filed on Jul. 12, 2005, Ser. No. 11/378,059 filed on Mar. 3, 2006, Ser. No. 11/606,523 filed on Nov. 11, 2006, Ser. No. 11/873,719 filed on Oct. 17, 2007 and Ser. No. 11/873,851 filed on Oct. 17, 2007. All of the patent applications and patents mentioned above are incorporated herein by reference. 286

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat. No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati, U.S. Pat. No. 7,078,739 to Nemati. It should be noted that U.S. Pat. No. 5,554,870 to Fitch, U.S. Pat. No. 6,229,161 to Nemati and U.S. Pat. No. 7,078,739 to Nemati disclose the formation of both horizontal and vertical semiconductor devices on a single major surface of a substrate.

It is desirable to provide computer chips that can operate faster so that they can process more data in a given amount of time. The speed of operation of a computer chip is typically measured in the number of instructions in a given amount of time it can perform. Computer chips can be made to process more data in a given amount of time in several ways. For example, they can be made faster by decreasing the time it takes to perform certain tasks, such as storing and retrieving information to and from the memory chip. The time needed to store and retrieve information to and from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are generally not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. Further, the yield of the computer chips fabricated in a run decreases as their area increases, which increases the overall cost.

Instead of embedding the memory devices on the same surface as the other devices, the memory chip can be bonded to the computer chip to form a stack, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using high pitch conductive interconnects which extend therebetween. Examples of 3-D ICs are disclosed in U.S. Pat. Nos. 5,087,585, 5,308,782, 5,355,022, 5,915,167, 5,998,808 and 6,943,067.

There are several problems, however, with using 3-D packages and 3-D ICs. One problem is that the use of wire bonds increases the access time between the computer and memory chips because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. These chips need to be properly aligned with each other and the interconnects because the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions. It is also very difficult to fabricate high pitch conductive interconnects.

Accordingly, it is highly desirable to provide a new method for embedding memory devices using wafer bonding which is cost effective and reliable.

BRIEF SUMMARY OF THE INVENTION

The present invention provides a method, which includes providing first and second substrates, and forming a bonding interface between the first and second substrates with a conductive bonding region. The method includes removing a portion of the second substrate. The portion of the second substrate is typically removed after the bonding interface is formed.

The method can include many other steps. For example, in some embodiments, the method includes removing a portion of the conductive bonding region. The portion of the conductive bonding region is typically removed after the portion of the second substrate is removed. In some embodiments, the method includes forming a vertically oriented semiconductor device. The portion of the conductive bonding region is typically removed before the vertically oriented semiconductor device is formed.

In some embodiments, the step of removing the portion of the second substrate includes forming a mesa structure. In these embodiments, the method can include removing a portion of the conductive bonding region. In these embodiments, the method can include removing a portion of the conductive bonding region so the mesa structure is carried by a contact. The portion of the conductive bonding region is typically removed after the mesa structure is formed. The contact is typically formed after the mesa structure is formed. In these embodiments, the method can include forming a vertically oriented semiconductor device with the mesa structure. The vertically oriented semiconductor device is typically carried by the contact. The portion of the conductive bonding region is typically removed after the mesa structure is formed, and before the vertically oriented semiconductor device is formed.

The present invention provides a method, which includes providing first and second substrates, and using a conductive bonding region to form a bonding interface between the first and second substrates. The method includes forming a vertically oriented semiconductor device. The vertically oriented semiconductor device is typically formed after the bonding interface is formed. In some embodiments, the first substrate includes electrical circuitry connected to the vertically oriented semiconductor device through the bonding interface. The electrical circuitry is typically formed before the bonding interface is formed.

The method can include many other steps. For example, in some embodiments, the method includes heating the conductive bonding region to reduce its number of defects. The method can include removing a portion of the conductive bonding region after the bonding interface is formed.

The step of forming the vertically oriented semiconductor device typically includes forming a mesa structure. The method can include removing a portion of the conductive bonding region so the mesa structure is carried by a contact.

The present invention provides a method, which includes providing an interconnect region and providing a first substrate. The method includes forming a bonding interface between the interconnect region and first substrate using a conductive bonding region, and processing the first substrate to form a mesa structure. The mesa structure is typically formed after the bonding interface is formed. In some embodiments, the interconnect region includes a conductive line connected to the mesa structure through the bonding interface.

The method can include many other steps. For example, in some embodiments, the method includes removing a portion of the conductive bonding region. In some embodiments, the method includes forming a vertically oriented semiconductor device.

The present invention provides a method of coupling substrates together which includes providing a first substrate; providing a second substrate with a conductive bonding region coupled to it; providing heat to the conductive bonding region to reduce its number of defects; and bonding the surface of the conductive bonding region to the first substrate so that the conductive bonding region and the first substrate are coupled together.

The present invention also provides a method of coupling substrates together including providing first and second substrates, at least one of the first and second substrates having a conductive bonding region formed thereon; providing heat to reflow the surface of at least one conductive bonding region to planarize it; and coupling the first and second substrates together with the conductive bonding region(s).

The present invention further provides a method of forming a circuit providing first and second substrates, each having metal bonding regions formed thereon; heating at least one of the metal bonding regions to reflow its corresponding bonding surface; and forming a metal-to-metal bond between the bonding surfaces of the metal bonding regions so that the first and second substrates are coupled together.

These and other features, aspects, and advantages of the present invention will become better understood with reference to the following drawings, description, and claims.

BRIEF DESCRIPTION OF THE DRAWINGS

FIGS. 1A, 1B, 1C, 1D, 1E and 1F are sectional views of a method of fabricating a circuit, in accordance with the present invention.

FIGS. 2A, 2B, 2C, 2D, 2E and 2F are sectional views of another method of fabricating a circuit, in accordance with the present invention.

FIG. 2G is a perspective view of one embodiment of a mesa structure formed using the method of FIGS. 2A-2F.

FIGS. 4A, 4B and 4C are flow diagrams of methods, in accordance with the invention, of fabricating a circuit structure.

DETAILED DESCRIPTION OF THE INVENTION

Figure 1D:
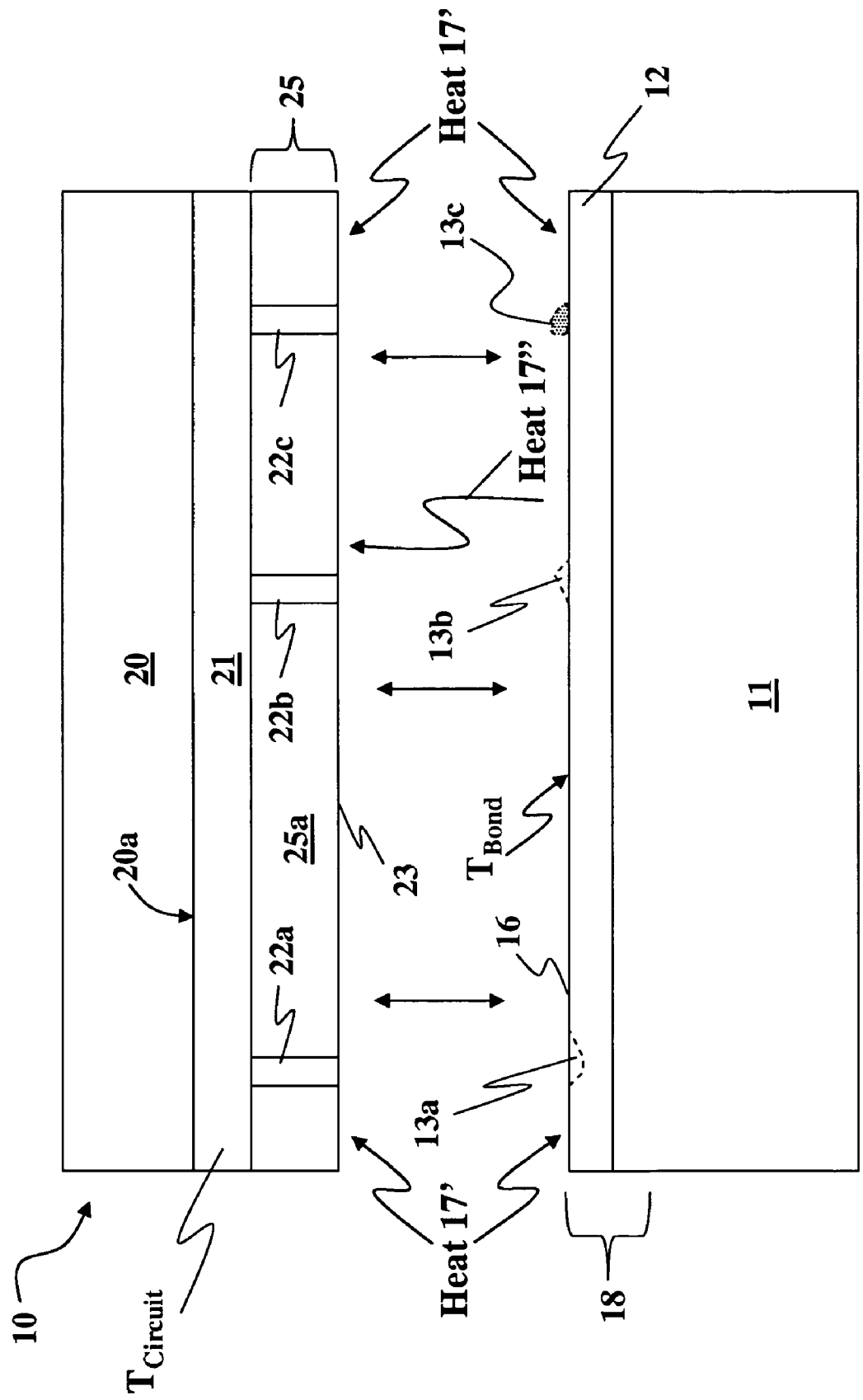

FIGS. 1A-1F are sectional views of steps in fabricating a circuit 10 in accordance with the present invention. It should be noted that in the following figures, like reference characters indicate corresponding elements throughout the several views. Circuit 10 is formed using a wafer bonding method which has several advantages. One advantage is that the wafers can be more strongly bonded together because the method reduces the number of defects on the bonding surfaces. There are fewer defects on the bonding surfaces because one or more of the bonding surfaces is reflowed at a high reflow temperature so the number of defects is reduced. The defects can form microvoids between the bonding surfaces when the wafers are coupled together. Microvoids are regions of missing material formed between the two bonding surfaces when they are coupled together. Since the bond strength increases with the contact area between the two bonding surfaces, fewer microvoids indicate a stronger bond.

Another advantage of this wafer bonding method is that the number of electronic devices which can be formed is increased. Typically, one of the bonded wafers is etched to form electronic devices which are bonded to the surface of the other wafer. Hence, the presence of defects on this surface can cause toppling or adhesion problems with these electronic devices. If an electronic device topples over or does not properly adhere to the bonding surface, then this surface area is wasted because the device will not function properly.

Another advantage is that the wafer bonding method allows the wafers to be coupled together without negatively impacting the electrical properties of either of the wafers. The bonding method also allows the wafers to be coupled together without negatively impacting the performance of any circuitry carried by either of the wafers. One reason the electrical properties and/or performance of the circuitry can be negatively impacted is because the high reflow temperature can cause unwanted diffusion of dopants or materials included therein.

In accordance with the invention, the degradation of the electrical properties and/or performance of the circuit is reduced because the circuit's temperature is controlled. The circuit's temperature is controlled by providing the heat to reflow the surface at the reflow temperature for a short period of time. In this way, the temperature of the circuitry will not increase by too much because the heat will not have enough time to flow to it. The heat to bond the surfaces together is provided for a longer period of time, but it has a lower energy so that the temperature of the circuit is not increased to where its electrical properties and/or performance would be significantly degraded.

Heating up the circuitry too much can decrease its reliability because the devices included therein can be adversely affected by the heat. For example, at high temperatures, conductive interconnect lines can melt and/or react with other elements to become more insulating so that their series resistance undesirably changes. Further, conductive contacts can cause junction spikes which form when material from the conductive contacts diffuses through an adjacent semiconductor region because of an increase in temperature. The material from the conductive contacts can negatively impact the electrical properties of the semiconductor region it diffuses into by undesirably changing its conductivity.

Too much heat can also adversely affect any doped regions included in the electronic devices, such as the regions which form a pn junction. This is because too much heat can cause the dopants to undesirably diffuse to other regions of the device. This unwanted diffusion of the dopants can negatively impact the circuitry's reliability and/or performance parameters by changing the conductivity of the doped regions included therein. Typical performance parameters which can be affected include the gain, reverse leakage current, and turn-on voltage, among others.

In some embodiments, it may be desired to perform the reflow and bonding in an inert gas environment because the bonding surface can be oxidized at elevated temperatures. As a result, the oxidized bonding surface may have a high resistance which undesirably attenuates electrical signals flowing therethrough. Suitable inert gases can include argon (Ar), nitrogen (N), or another gas which does not substantially react with the material included in the bonding surface. If the processing is performed without the inert gas environment and the bonding surface is oxidized, then its surface can be etched by plasma etching or cleaned with a chemical solution, for example, to remove the oxidation.

In FIG. 1A, partially fabricated circuit 10 includes a substrate 11 with a conductive bonding region 12 coupled thereto. Substrate 11 can include many different types of materials. In general, substrate 11 includes one or more layers of semiconductor material. The layers of semiconductor material of substrate 11 are generally stacked on each other. The semiconductor materials can be of many different types, such as silicon, silicon-germanium, gallium arsenide, gallium nitride and alloys thereof. The alloys of these semiconductor materials generally include the binary, tertiary and quaternary alloys. More information regarding the materials which can be included with substrate 11, as well as how they are stacked on each other, is provided in the related patents and patent applications incorporated herein by reference above.

Conductive bonding region 12 generally includes a defective surface 13 which can be defective for a number of reasons. One reason is that in conventional deposition methods, the material included in conductive bonding region 12 is generally not evenly deposited which can create valleys 13a and/or hillocks 13b adjacent to surface 13. Another reason is that in conventional deposition methods, particle contamination 13c can be inadvertently deposited adjacent to surface 13. Particle contamination can include particles from various materials, such as semiconductors, metals, and/or insulators which can be deposited during subsequent processing. For example, if surface 13 is chemical mechanically polished, then a slurry of material contaminants can be undesirably deposited thereon.

As discussed in more detail below, it is typically desired to bond surface 13 to another surface. Accordingly, the presence of valleys 13a, hillocks 13b, and/or contamination 13c can cause microvoids to form between surface 13 and the other surface. The microvoids can cause toppling and/or missing devices. Also, these defects can reduce the bond strength between surface 13 and the other surface. As a result, it is desired to reduce the presence of these defects so that fewer microvoids are formed.

In some embodiments, surface 13 is reflowed by heating it so that the material included in region 12 moves into valley 13a and away from hillock 13b, and these defects are reduced or removed. The heat can also cause contamination 13c to desorb from surface 13. In this way, the defects of surface 13 are reduced so that fewer microvoids are formed when it is bonded to the other surface. The reduction in the number of defects also increases the reliability of circuit 10 because the bond is more likely to remain strong for a longer period of time during subsequent wafer processing steps, such as patterning, etching, cleaning, etc.

The bond is also more likely to remain strong through the temperature cycles of circuit 10 which it is frequently subjected to during normal operation. The temperature cycles can be from turning the circuit on and off, or from having the circuit go from a state of performing many operations to an idle state. The temperature of the circuit is higher when it is turned on and performing many operations and it is lower when the circuit is turned off or in an idle state. Accordingly, the temperature of a typical circuit can fluctuate in a temperature range of several hundred degrees Fahrenheit and if the bond is not strong, then the circuit can perform poorly and/or fail.

The other surface bonded to surface 13 typically includes a metal so that surface 13 and the other surface form a metal-to-metal bond. The metal-to-metal bond is thought to form because of the interaction between the electrons of the two metals. The very highest quality metal-to-metal bond is a thermal bond, where the parameters which determine the bond strength of a thermal bond are typically force or pressure, temperature, and time. The force or pressure applied to the two surfaces to be bonded is high enough to ensure intimate contact. The time required is dependent on the temperature, with higher temperatures being associated with lower times.

The bond strength of metal-to-metal bonds increases with the contact area between the two bonding surfaces. Accordingly, valleys 13a, hillocks 13b and/or contamination 13c reduce the bond strength because their presence reduces the contact area between the two bonding surfaces. One reason the contact area is reduced is because the presence of these defects causes microvoids to form between surface 13 and the other surface when they are coupled together. As discussed above, microvoids are regions of missing material formed between the bonding surfaces.

Surface 13 can be reflowed in many different ways. In FIG. 1B, light 17 is provided to conductive bonding region 12 to reflow surface 13 by heating it to reflow temperature $T_{Reflow}$ to reduce its number of defects. Light 17 can be provided by various light sources, such as a white light source or a laser. Accordingly, the light can be coherent or incoherent and its frequency spectrum can be narrow or broad as long as it can provide the desired amount of heat to reflow surface 13. In one embodiment, light 17 has a wavelength spectrum chosen so that it is absorbed near surface 13. Suitable wavelength spectrums include the visible or infrared spectrums of light, although other spectrums may be suitable. In this way, light 17 causes the temperature of region 12 to increase to temperature $T_{Reflow}$ by providing heat 19. If $T_{Reflow}$ is chosen to be high enough, then material 14 and 14' of region 12 can diffuse into valley 13a and material 15 and 15' in hillock 13b can diffuse away from hillock 13b. Further, particle contamination 13c can desorb from surface 13 as desorption particle 13c'.

The removal of one or more of these defects provides a reflow surface 16 as shown in FIG. 1C. Reflow surface 16 has fewer defects than surface 13 and, consequently, is more likely to form a stronger and more reliable bond with the other surface it is bonded to. In FIG. 1C, valley 13a, hillock 13b, and particle contamination 13c are shown in phantom with dotted lines for reference purposes to indicate their location if surface 13 had not been reflowed to provide reflow surface 16.

Temperature $T_{Reflow}$ substantially depends on the material included in region 12. For example, aluminum (Al) has a melting temperature of about 670° C. (degrees Celsius) so $T_{Reflow}$ should be in a range from about 600° C. to 700° C. if region 12 includes aluminum. Region 12 can also include alloys, such as an aluminum alloy with a reflow temperature between about 200° C. to 650° C., a zinc alloy with a reflow temperature between about 380° C. to 484° C., or a tin alloy with a reflow temperature between about 220° C. to 420° C. It should be noted, however, that the reflow temperature can be outside of these ranges and will substantially depend on the material(s) included in region 12.

In FIG. 1D, a substrate 20 is provided which, in this embodiment, carries a circuit 21. It should be noted that circuit 21 is generally included with substrate 20 and can extend therethrough. However, in this embodiment, circuit 21 is shown as being positioned on substrate 20 for illustrative purposes. Circuit 21 can include many different types of electronic devices, such as transistors, resistors, capacitors, and/or inductors, among others. The electronic circuitry included with circuit 21 can be coupled together to operate as analog and/or digital circuitry. Examples of electronic circuitry include control circuitry, sense amplifiers, processor circuitry, etc. It should be noted that circuit 21 can include horizontal and/or vertical devices, examples of which are provided in the references cited herein. The horizontal devices of circuit 21 extend generally parallel to a major surface 20a of substrate 20, and the vertical devices of circuit 21 extend perpendicular to surface 20a.

An interlayer dielectric (ILD) region 25 is connected to circuit 21. In this embodiment, ILD region 25 is positioned on circuit 21 and carried by substrate 20 for illustrative purposes. In this embodiment, ILD region 25 includes conductive interconnects 22a, 22b and 22c which extend through a dielectric material region 25a. It should be noted that ILD region 25 is often referred to as an interconnect region. Conductive interconnects 22a, 22b, and 22c are connected to circuit 21 and extend through dielectric material region 25a and to a bonding surface 23 of ILD region 25. Interconnects 22a, 22b, and 22c are typically connected to different electronic devices (not shown) in circuit 21 so that they each communicate different electrical signals, although this is not essential. Dielectric region 25 has a lower conductivity than interconnects 22a-22c so that it behaves as an insulator. Interconnects 22a, 22b, and 22c are often referred to as conductive vias because they extend perpendicular to surface 23. It should be noted that portions of interconnects 22a, 22b and 22c can extend parallel to surface 23. It should also be noted that substrate 20, ILD region 25, and/or circuit 21 generally include one or more layers of material, such as a semiconductor layer, metal layer, and/or insulator layer. However, these layers of material are not shown here for simplicity and ease of discussion. Examples of electronic devices, as well as interlayer dielectric regions and substrates, can be found in U.S. Pat. Nos. 4,704,785, 4,829,018, 4,939,568, 5,087,585, 5,093,704, 5,106,775, 5,266,511, 5,308,782, 5,355,022, 5,554,870, 5,627,106, 5,835,396, 5,977,579, 5,998,808, 6,153,495, 6,222,251, 6,331,468, 6,600,173, 6,630,713, 6,677,204, 6,943,067, 6,943,407, 6,995,430, 7,078,739, as well as U.S. Patent Application Nos. 20020024140, 20020025604, 20020141233, 20030067043, 20030113963, 20030139011, 20040113207, 20040155301 and 20040160849.

In this embodiment, a region 18 is heated to a temperature $T_{Bond}$ at which it is desired to bond surface 16 to surface 23. It should be noted that a bonding interface 29 (FIG. 1E) is formed in response to bonding surfaces 16 and 23 together. Region 18 can include region 12 and a portion of substrate 11 proximate to region 12. Region 18 is heated by providing heat 17' to region 12. Heat 17' can be provided to region 12 by a light source, such as a laser and/or a conventional heater, such as a heating chuck. Heat 17' can also be provided to surface 23 by the light source and/or conventional heater. If heat 17' is provided by a light source, then the light should have a wavelength spectrum chosen so that it is absorbed near surface 16 and 23. A suitable wavelength spectrum for most materials included in regions 12 and 25 includes the visible or infrared spectrums of light. Conventional heaters typically provide heat that has a longer wavelength spectrum than visible light, such as infrared light. In an alternative embodiment, however, the heat provided to surface 23 can be from heat 17' reradiated from surface 16 instead of from heat 17'. In any of these embodiments, different amounts of heat can be provided to surfaces 16 and 23, with the amount of heat depending on the materials proximate to surfaces 16 and 23.

Temperature $T_{Bond}$ is chosen to be a temperature less than $T_{Reflow}$ so that the temperature of circuit 21, denoted as $T_{Circuit}$, is not increased by too much. If $T_{Circuit}$ is increased by too much, then the various devices included therein can experience performance degradation and have reliability issues, as discussed above. $T_{Bond}$ can be adjusted in a number of different ways. For example, $T_{Bond}$ can be adjusted by choosing the intensity and/or frequency of heat 17'. $T_{Bond}$ can also be adjusted by directing heat from the heat source to region 18 without adversely increasing $T_{Circuit}$. $T_{Bond}$ can also be chosen by using a combination of heat from the light source and the heater.

Figure 1E:
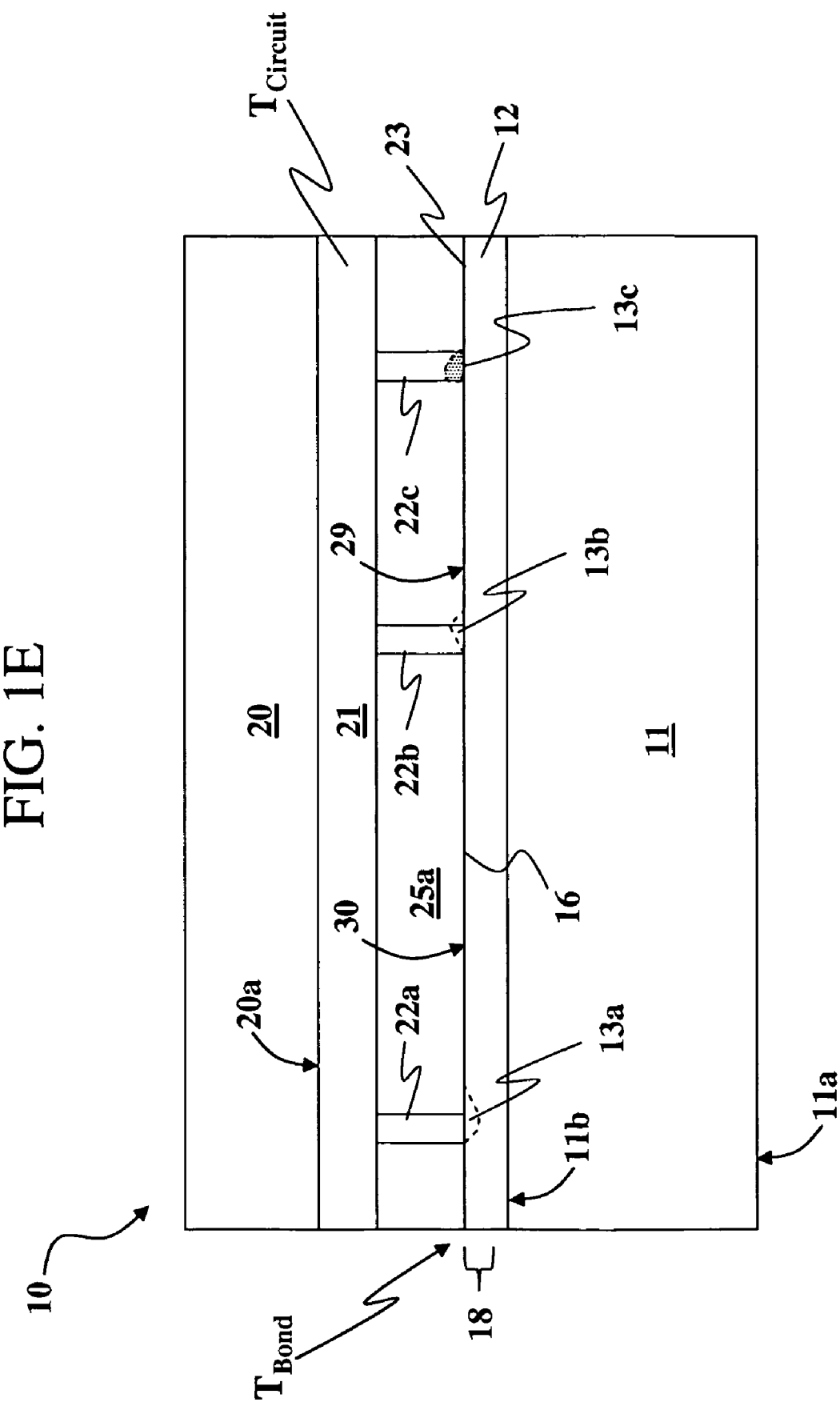

It should be noted that in some embodiments, a metallic region can be positioned on surface 23. However, surface 23 is shown as being a surface 30 of ILD layer 25 for simplicity. Other examples of bonding surfaces and bonding interfaces are disclosed in U.S. patent application Ser. No. 11/092,501, entitled "SEMICONDUCTOR BONDING AND LAYER TRANSFER METHOD," filed on Mar. 29, 2005, and is incorporated herein by reference. If a metallic region is positioned on surface 23, it can include the same metal as region 12 or it can include a different metal. The choice of metals in these regions substantially depends on the desired bonding properties between them. In FIG. 1E, surfaces 16 and 23 are positioned adjacent to each other and the heat is removed after a predetermined time so that bonding interface 29 is formed in response, and substrates 11 and 20 are coupled together through bonding interface 29.

A bonding interface is an interface that is formed in response to bonding material layers together. In one example of forming a bonding interface, first and second material layers are formed as separate layers, and moved towards each other so that they engage each other and the bonding interface is formed in response. It should be noted that heat is generally applied to the first and/or second material layers to facilitate the formation of the bonding interface.

A growth interface is an interface that is formed in response to growing a material layer on another material layer. In one example of forming a growth interface, a third material layer is formed, and a fourth material layer is grown on the third material layer so that the growth interface is formed in response. The fourth material layer can be grown on the third material layer in many different ways, such as by chemical vapor deposition or sputtering. Hence, when forming a growth interface, third and fourth material layers are not formed as separate layers, and moved so that they engage each other.

More information regarding bonding and growth interfaces can be found in U.S. patent application Ser. No. 11/606,523, entitled THREE-DIMENSIONAL INTEGRATED CIRCUIT STRUCTURE, filed on Nov. 30, 2006 by the same inventor, the contents of which are incorporated herein by reference. Information regarding bonding and growth interfaces can also be found in U.S. Pat. Nos. 5,152,857, 5,695,557, 5,980,633 and 6,534,382.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects at the interface. Information regarding TEM can be found in U.S. Pat. Nos. 5,892,225, 6,531,697, 6,822,233, 7,002,152.

Figure 1F:
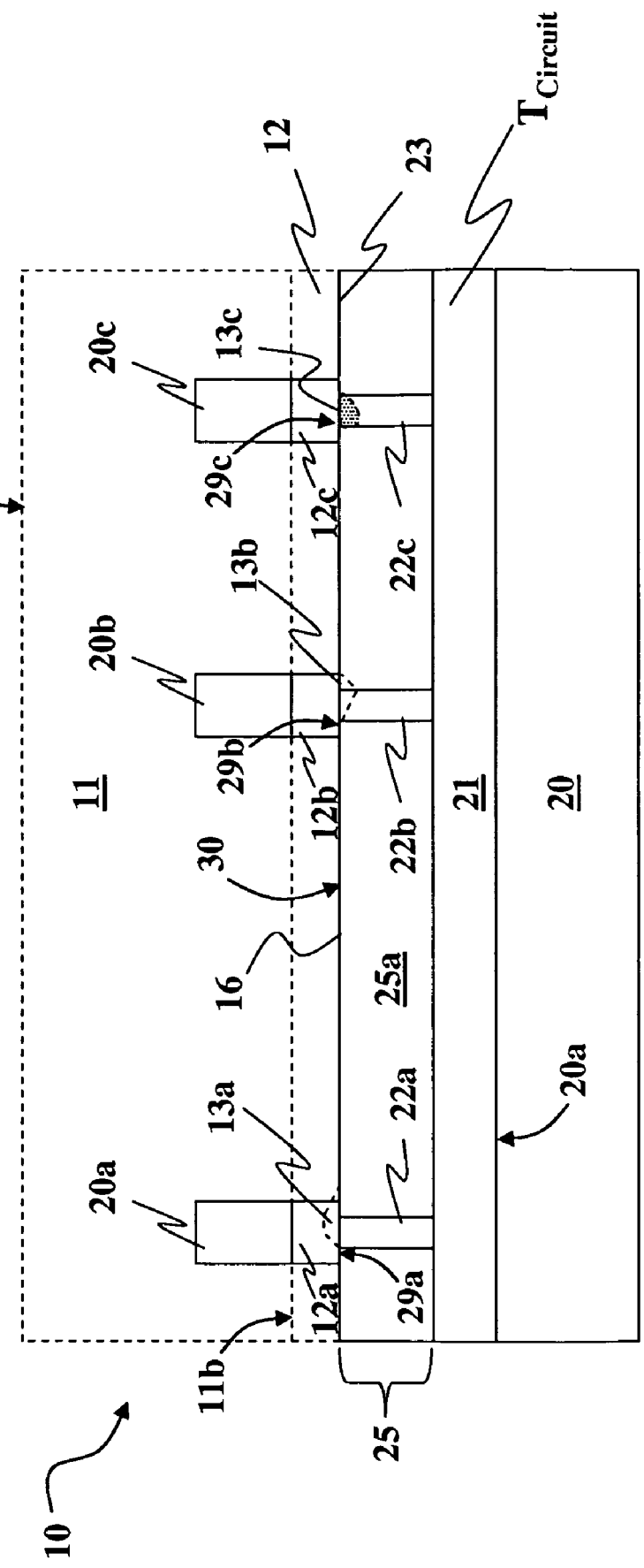

In FIG. 1F, portions of substrate 11 and conductive region 12 are removed to form mesa structures 20a, 20b, and 20c which are coupled to respective interconnects 22a, 22b, and 22c through conductive contacts 12a, 12b, and 12c, respectively. The portions of region 12 which are not removed are conductive contacts 12a, 12b and 12c. In this way, portions of substrate 11 and conductive region 12 are selectively removed to form mesa structures 20a, 20b and 20c, as well as conductive contacts 12a, 12b, and 12c. The portions of substrate 11 and region 12 which are removed are shown in phantom.

The portions of substrate 11 and region 12 can be selectively removed in many different ways, such as by using wet and/or dry etching and an appropriate mask. It should be noted that the portion of substrate 11 that is removed is removed by etching through a surface 11a of substrate 11. In particular, the portion of substrate 11 that is removed is removed by etching through surface 11a towards a surface 11b of substrate 11. Surface 11a is positioned away from conductive region 12, and surface 11b is positioned towards conductive region 12.

It should be noted that conductive contacts 12a, 12b and 12c are adjacent to a portion of bonding interface 29, which is denoted as bonding interfaces 29a, 29b and 29c, respectively. In this embodiment, bonding interface 29a extends between conductive contact 12a and ILD region 25, bonding interface 29b extends between conductive contact 12b and ILD region 25 and bonding interface 29c extends between conductive contact 12c and ILD region 25. Bonding interface 29a extends between conductive contact 12a and interconnect 22a, bonding interface 29b extends between conductive contact 12b and interconnect 22b and bonding interface 29c extends between conductive contact 12c and interconnect 22c. Further, in some embodiments, bonding interface 29a extends between conductive contact 12a and dielectric material 25a, bonding interface 29b extends between conductive contact 12b and dielectric material 25a and bonding interface 29c extends between conductive contact 12c and dielectric material 25a. Hence, in some embodiments, portions of bonding interfaces 29a, 29b and 29c are metal-to-metal bonding interfaces, and other portions of bonding interfaces 29a, 29b and 29c are metal-to-dielectric bonding interfaces. It should also be noted that conductive contacts 12a, 12b, and 12c are typically formed after mesa structures 20a, 20b, and 20c are formed. Further, mesa structures 20a, 20b, and 20c are typically formed before conductive contacts 12a, 12b, and 12c are formed.

In FIG. 1F, mesa structures 20a, 20b, and 20c are coupled with ILD region 25 with conductive contacts 12a, 12b, and 12c, respectively. Further, mesa structures 20a, 20b, and 20c are carried by conductive contacts 12a, 12b, and 12c, respectively. Mesa structures 20a, 20b, and 20c are coupled with ILD region 25 through bonding interfaces 29a, 29b and 29c, respectively. Mesa structures 20a, 20b, and 20c are coupled with interconnects 22a, 22b, and 22c, respectively, through bonding interfaces 29a, 29b and 29c, respectively.

Mesa structures 20a, 20b, and 20c are connected to interconnects 22a, 22b, and 22c, respectively, through bonding interfaces 29a, 29b and 29c, respectively, so that one or more signals can flow therebetween. Further, mesa structures 20a, 20b, and 20c are in communication with interconnects 22a, 22b, and 22c, respectively, through bonding interfaces 29a, 29b and 29c, respectively, so that one or more signals can flow therebetween.

Mesa structures 20a, 20b, and 20c are connected to circuit 21 through bonding interfaces 29a, 29b and 29c, respectively, so that one or more signals can flow therebetween. Further, mesa structures 20a, 20b, and 20c are connected to circuit 21 through bonding interfaces 29a, 29b and 29c, respectively, and contacts 12a, 12b and 12c, respectively, so that one or more signals can flow therebetween. In particular, mesa structures 20a, 20b, and 20c are connected to circuit 21 through bonding interfaces 29a, 29b and 29c, respectively, contacts 12a, 12b and 12c, respectively, and interconnects 22a, 22b, and 22c, respectively, so that one or more signals can flow therebetween.

Figure 1G:
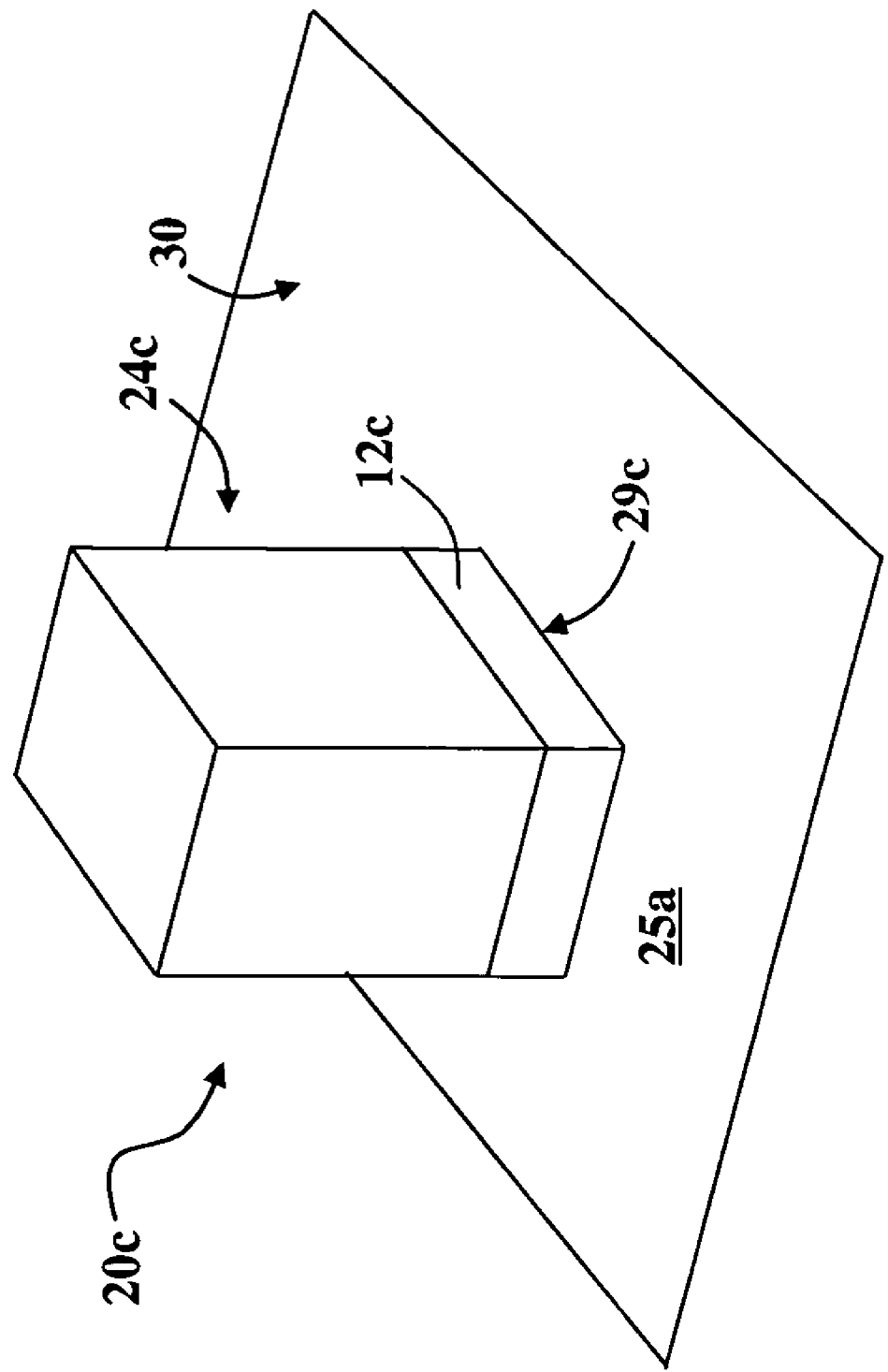
FIG. 1G is a perspective view of one embodiment of a mesa structure formed using the method of FIGS. 1A-1F.

FIG. 1G is a perspective view of one embodiment of mesa structure 20c formed using the method of FIGS. 1A-1F. It should be noted that mesa structures 20a and 20b are the same or similar to mesa structure 20c. In this embodiment, mesa structure 20c has a cubic shape. However, as mentioned below with FIG. 2G, mesa structure 20c can have other shapes, such as cylindrical, if desired.

It should be noted that mesa structures 20a, 20b, and 20c can include one or more layers of semiconductor material, which are not shown for simplicity and ease of discussion. Further, it should also be noted that mesa structures 20a, 20b and 20c can be processed to form a vertically oriented semiconductor device. The vertically oriented semiconductor device can be of many different types, such as a diode, transistor, thyristor, etc. The vertically oriented semiconductor device can operate in many different ways, such as a semiconductor memory, image sensor, transistor, capacitor, resistor, or switch, among others. In one particular example, the vertically oriented semiconductor device operates as a static or dynamic random access memory device.

More information regarding forming conductive contacts 12a, 12b, and 12c and mesa structures 20a, 20b and 20c, and how mesa structures 20a, 20b and 20c can be processed to form vertically oriented semiconductor devices, can be found in co-pending U.S. patent application Ser. No. 11/092,500, entitled "SEMICONDUCTOR MEMORY DEVICE", and Ser. No. 11/092,521, entitled "ELECTRONIC CIRCUIT WITH EMBEDDED MEMORY," as well as the other related patents and patent applications incorporated herein by reference above.

As can be seen in FIG. 1F, if valley 13a, hillock 13b, and contamination 13c where still present in region 12, then the adhesion of conductive contacts 12a, 12b, and/or 12c to respective interconnects 22a, 22b, and 22c can be negatively affected. If the adhesion is poor, then mesa structures 20a, 20b, and 20c would be weakly bonded to surface 23 since they are bonded thereto through corresponding interconnects 12a, 12b, and 12c. This can negatively affect the yield, reliability, and/or performance of circuit 10. The yield can be negatively affected because the probability that devices 12a, 12b, and/or 12c would not adhere to corresponding interconnects 22a, 22b, and 22c would increase. The reliability would be negatively impacted because, during operation of circuit 10, mesa structures 20a, 20b, and/or 20c, or the vertically oriented semiconductor devices formed therewith, can topple over. Further, the performance can decrease because the series resistance between contacts 12a, 12b, and/or 12c and corresponding interconnects 22a, 22b, and 22c can increase. An increased series resistance decreases the amplitude of signals flowing therethrough, which makes these signals noisier.

Figure 2A:
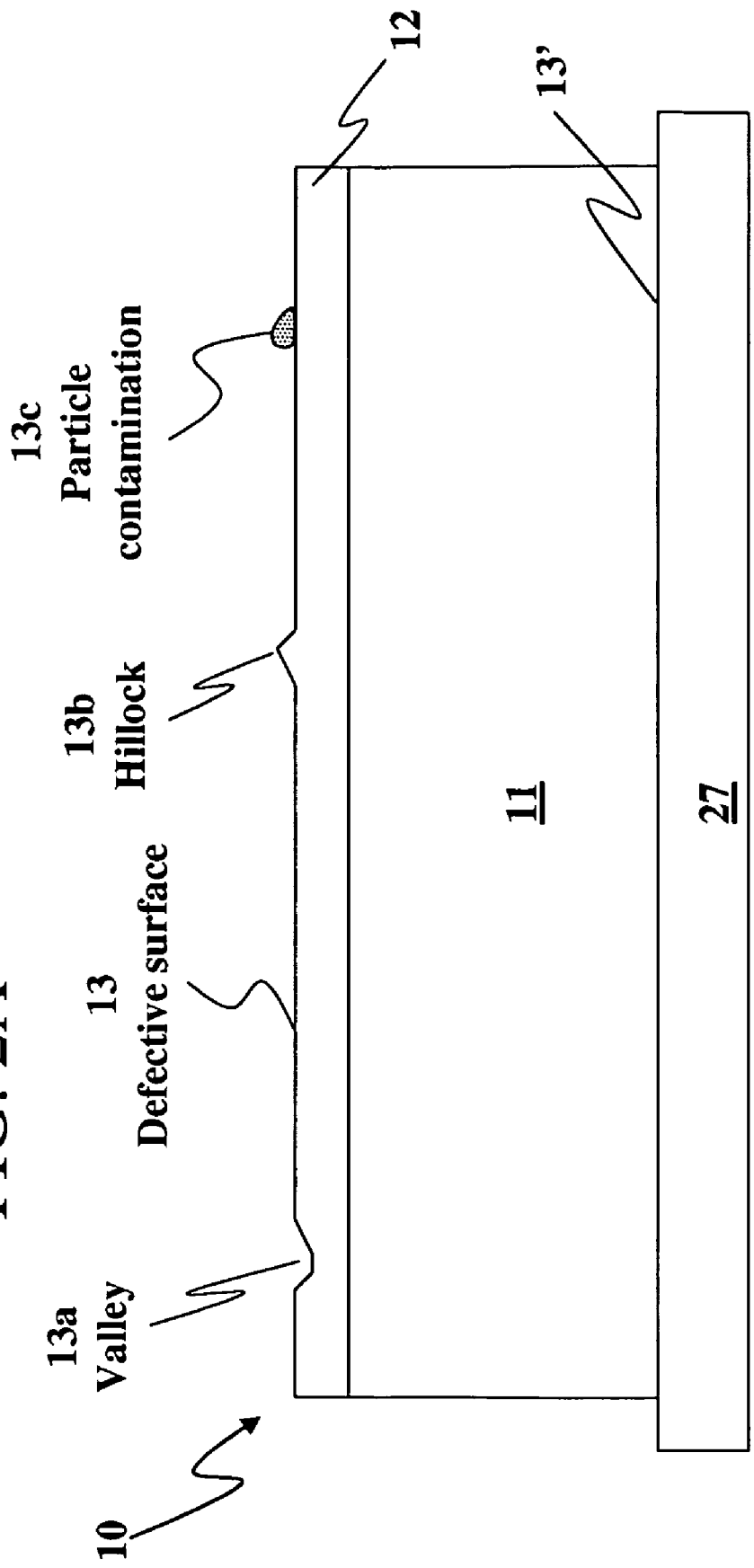

FIGS. 2A-2F shows several steps in another method of fabricating circuit 10. In this embodiment, substrate 11 is provided with region 12 positioned thereon. Region 12 has defective surface 13 with valleys 13a, hillocks 13b, and/or particle contamination 13c, as described above in conjunction with FIG. 1A. In FIG. 2A, a heater 27 carries partially fabricated circuit 10. In this particular example, heater 27 is positioned so that it supports substrate 11 on a surface 13' positioned opposite to region 12 and surface 13. Heater 27 can include a heating chuck or another heating element well known to those skilled in the art.

Figure 2B:
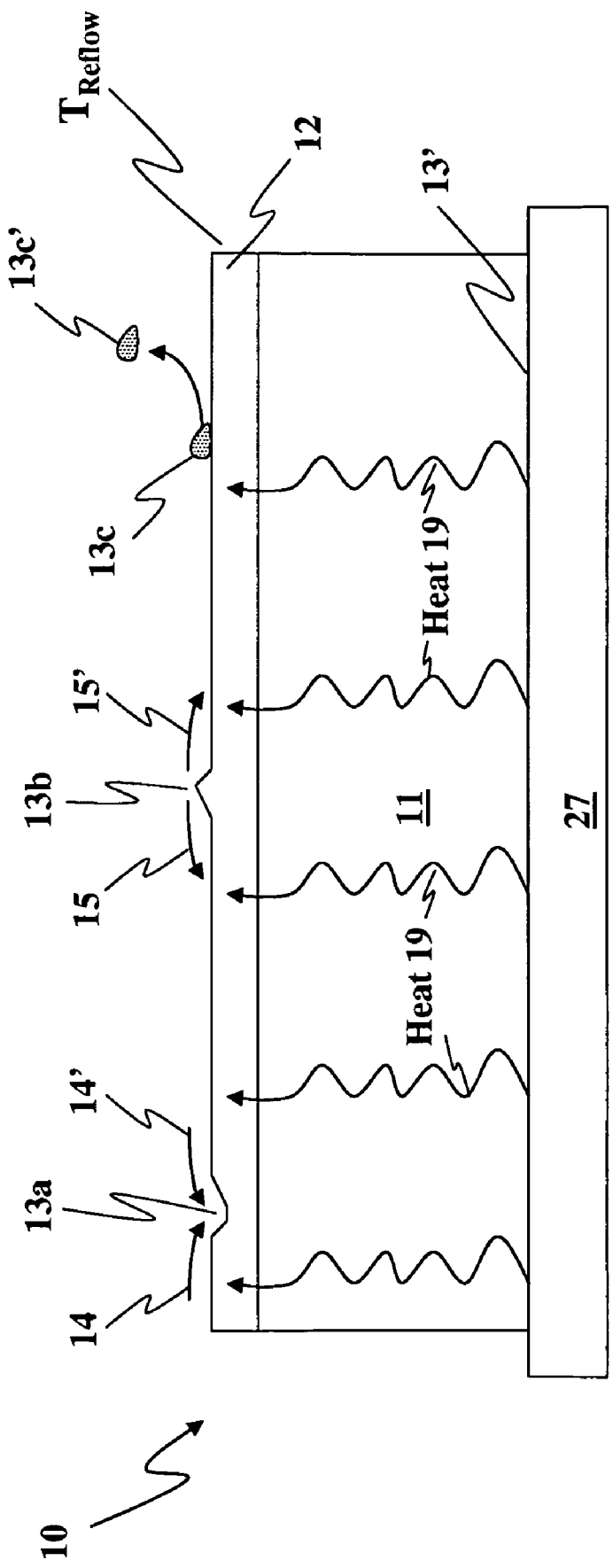

In FIG. 2B, heater 27 provides heat 19 which flows through substrate 11 and region 12 to heat up surface 13 to its reflow temperature $T_{Reflow}$. In response, surface 13 is reflowed so that material 14 and 14' of region 12 diffuses into valley 13a and material 15 and 15' of hillock 13b diffuses away from hillock 13b. Further, particle contamination 13c can desorb from surface 13 as desorption particle 13c' to provide reflow surface 16 as shown in FIG. 2C. In FIG. 2C, valley 13a, hillock 13b, and particle contamination 13c are shown in phantom with dotted lines to indicate their location if surface 13 had not been reflowed.

Figure 2D:
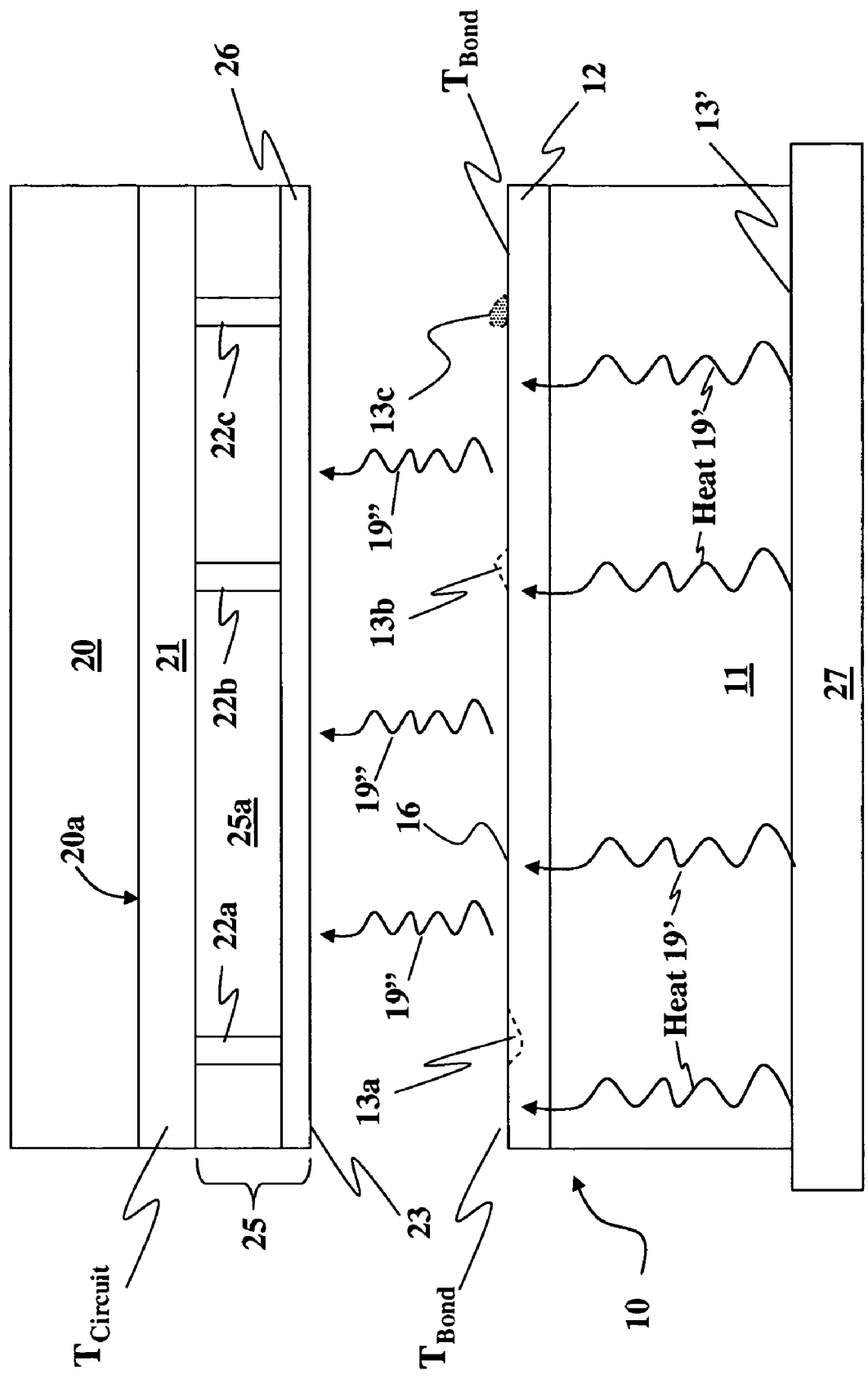

In FIG. 2D, substrate 20, circuit 21 and ILD layer 25 are provided, as described in more detail above. Interlayer dielectric region 25 is positioned on circuit 21. Conductive interconnects 22a, 22b, and 22c are coupled to circuit 21 and extend through dielectric region 25a where they contact a conductive region 26 positioned on ILD region 25. In this step, heater 27 outputs heat 19' which has less energy than heat 19 outputted in FIGS. 2A and 2B. In response, surface 16 is provided with temperature $T_{bond}$. A portion of heat 19', denoted as heat 19", is reradiated towards surface 23 where it is incident to it. In this embodiment, surface 23 is the surface of region 26 opposite ILD region 25.

Figure 2E:
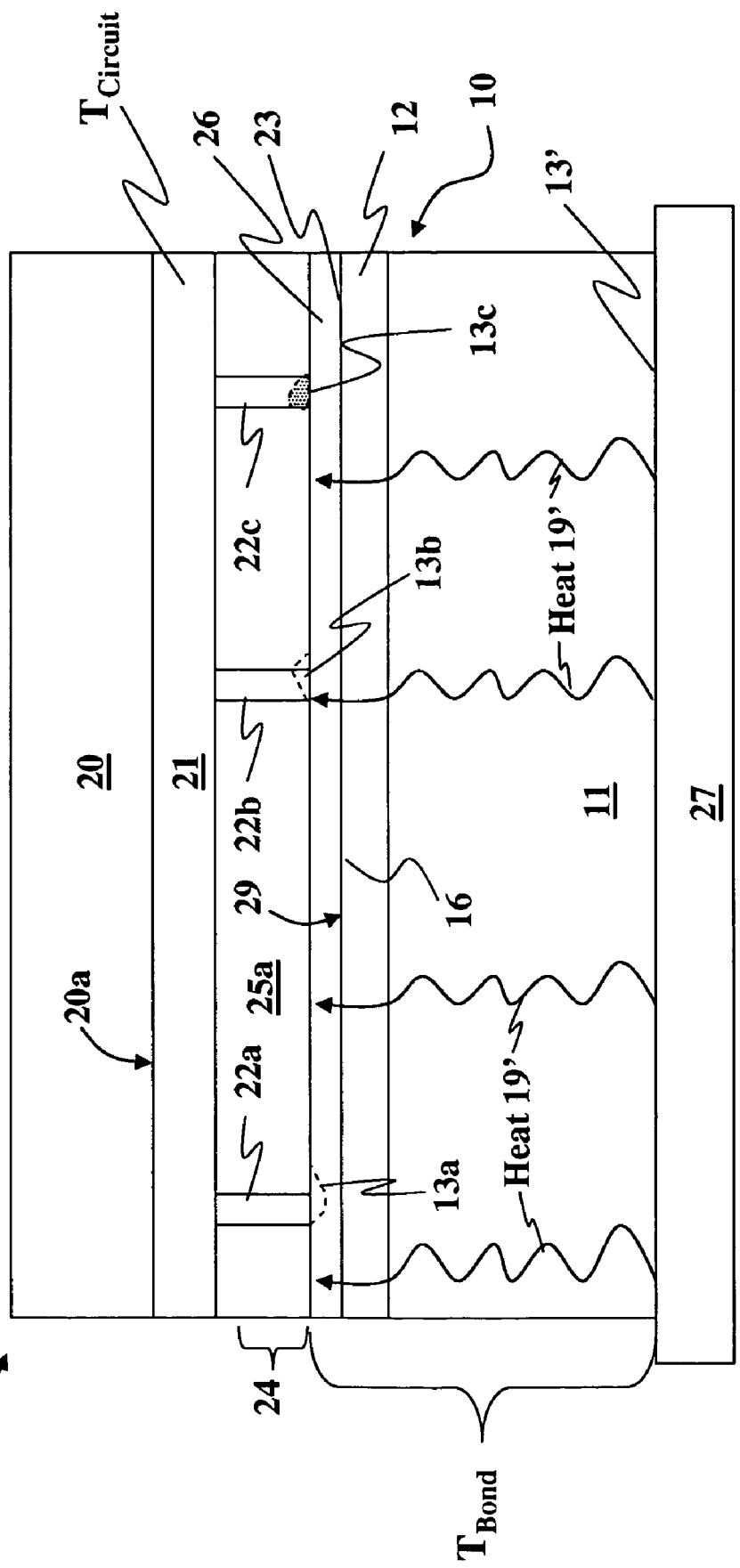

In FIG. 2E, surfaces 16 and 23 are positioned together, as shown, so that heat 19' flows into a region 24 which can extend into ILD region 25. In this embodiment, temperature $T_{Bond}$ is high enough so that regions 12 and 26 are bonded together, but is also low enough so that heat 19' does not increase $T_{Circuit}$ to a temperature which negatively impacts the performance and/or reliability of the electronic devices included in circuit 21. $T_{Bond}$ can be adjusted by adjusting the heat output of heater 27. In FIG. 2E, surfaces 16 and 23 are bonded together and heat 19' is removed after a predetermined time so that bonding interface 29 is formed and substrates 11 and 20 are coupled together. In this embodiment, bonding interface 29 is a metal-to-metal bonding interface.

In FIG. 2F, portions of substrate 11 and regions 12 and 26 are removed to form mesa structures 20a, 20b, and 20c which are coupled to respective contacts 26a, 26b, and 26c through contacts 12a, 12b, and 12c, respectively. Contacts 26a, 26b and 26c are the portions of region 26 which are not removed. The portions of substrate 11 and regions 12 and 26 which are removed are shown in phantom. The portions of substrate 11 and regions 12 and 26 can be removed in many different ways, such as by using wet and/or dry etching.

It should be noted that conductive contacts 12a, 12b and 12c and corresponding conductive contacts 26a, 26b and 26c are adjacent to a portion of bonding interface 29, which is denoted as bonding interfaces 29a, 29b and 29c, respectively. In this embodiment, bonding interface 29a extends between conductive contacts 12a and 26a, bonding interface 29b extends between conductive contacts 12b and 26b and bonding interface 29c extends between conductive contacts 12c and 26c. It should also be noted that conductive contacts 12a, 12b, and 12c and conductive contacts 26a, 26b and 26c are typically formed after mesa structures 20a, 20b, and 20c are formed. Further, mesa structures 20a, 20b, and 20c are typically formed before conductive contacts 12a, 12b, and 12c and conductive contacts 26a, 26b and 26c are formed. Conductive contacts 12a, 12b and 12c are typically formed before conductive contacts 26a, 26b and 26c are formed. Further, conductive contacts 26a, 26b and 26c are typically formed after conductive contacts 12a, 12b and 12c are formed.

In FIG. 2F, mesa structures 20a, 20b, and 20c are coupled with ILD region 25 with conductive contacts 12a, 12b, and 12c, respectively, and conductive contacts 26a, 26b, and 26c, respectively. Further, mesa structures 20a, 20b, and 20c are carried by conductive contacts 12a, 12b, and 12c, respectively, and conductive contacts 26a, 26b, and 26c, respectively. Mesa structures 20a, 20b, and 20c are coupled with ILD region 25 through bonding interfaces 29a, 29b and 29c, respectively. Mesa structures 20a, 20b, and 20c are coupled with interconnects 22a, 22b, and 22c, respectively, through bonding interfaces 29a, 29b and 29c, respectively.

Mesa structures 20a, 20b, and 20c are connected to interconnects 22a, 22b, and 22c, respectively, through bonding interfaces 29a, 29b and 29c, respectively, so that one or more signals can flow therebetween. Further, mesa structures 20a, 20b, and 20c are in communication with interconnects 22a, 22b, and 22c, respectively, through bonding interfaces 29a, 29b and 29c, respectively, so that one or more signals can flow therebetween.

Mesa structures 20a, 20b, and 20c are connected to circuit 21 through bonding interfaces 29a, 29b and 29c, respectively, so that one or more signals can flow therebetween. Further, mesa structures 20a, 20b, and 20c are connected to circuit 21 through bonding interfaces 29a, 29b and 29c, respectively, and conductive contacts 12a, 12b and 12c, respectively, and conductive contacts 26a, 26b, and 26c, respectively, so that one or more signals can flow therebetween. In particular, mesa structures 20a, 20b, and 20c are connected to circuit 21 through bonding interfaces 29a, 29b and 29c, respectively, contacts 12a, 12b and 12c, respectively, and conductive contacts 26a, 26b and 26c, respectively, and interconnects 22a, 22b, and 22c, respectively, so that one or more signals can flow therebetween.

FIG. 2G is a perspective view of one embodiment of mesa structure 20c formed using the method of FIGS. 2A-2F. It should be noted that mesa structures 20a and 20b are the same or similar to mesa structure 20c. In this embodiment, mesa structure 20c has a cylindrical shape. However, as mentioned above with FIG. 1G, mesa structure 20c can have other shapes, if desired.

As can be seen in FIG. 2F, if valley 13a, hillock 13b, and contamination 13c where still present in region 12, then mesa structures 20a, 20b, and 20c would be weakly bonded to surface 23. This can negatively affect the yield and reliability of devices circuit 10, as discussed in more detail above in conjunction with FIG. 1F.

Figure 3A:
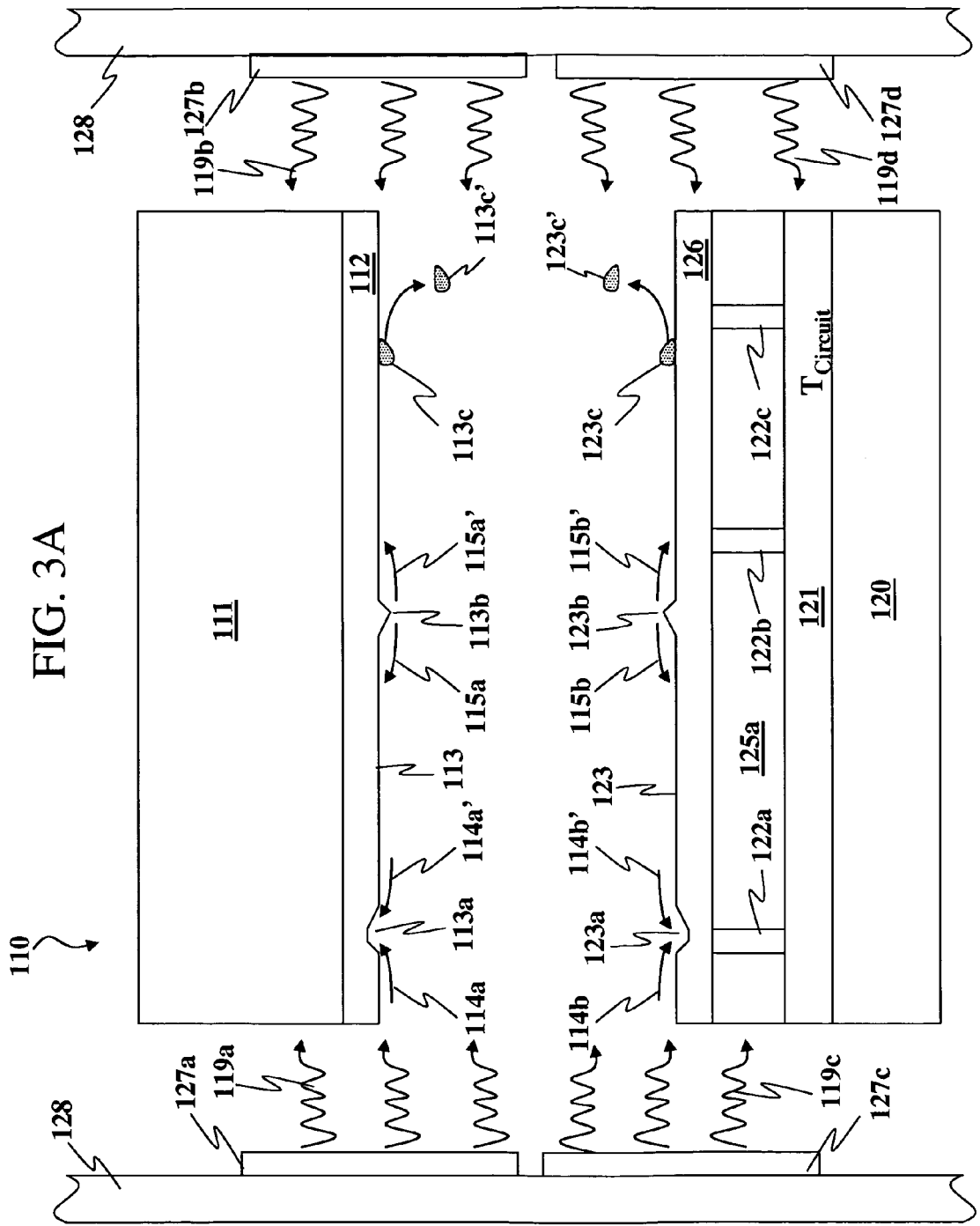
FIGS. 3A, 3B, 3C and 3D are sectional views of still another method of fabricating a circuit, in accordance with the present invention.

FIGS. 3A-3D show several steps in a method of fabricating a circuit 110. It should be noted that in the following discussion, similar elements to those discussed above are denoted with like reference characters with a '1' in front. In FIG. 3A, partially fabricated circuit 110 includes a substrate 120 which carries a circuit 121. An interlayer dielectric region 125a is positioned on circuit 121. Conductive interconnects 122a, 122b, and 122c are coupled to circuit 121 and extend through region 125a where they couple to a conductive region 126 positioned on dielectric region 125a. Region 126 has defective surface 123 which typically includes valleys 123a, hillocks 123b, and/or particle contamination 123c. A substrate 111 is provided with a conductive region 112 positioned thereon. Region 112 has defective surface 113 which typically includes valleys 113a, hillocks 113b, and/or particle contamination 113c.

In FIG. 3A, heating elements 127a and 127b are positioned proximate to conductive region 112 and heating elements 127c and 127d are positioned proximate to conductive region 126. In this embodiments, heating elements 127a-127d are positioned on a chamber wall 128 of a wafer bonding machine. However, this is not essential because heating elements 127a-127d can be positioned elsewhere as long as they can sufficiently heat corresponding regions 112 and 126. Heating elements 127a and 127b provide heat 119a and 119b. Similarly, heating elements 127c and 127d provide heat 119c and 119d, respectively. In this way, the corresponding heating elements heat surfaces 113 and 123 to temperature $T_{Reflow}$.

Heat 119c and 119d should be provided so that the temperature of circuit 121, denoted as $T_{Circuit}$ does not increase to a value which negatively impacts the performance and/or reliability of the devices included therein. One way to do this is to provide heat 119c and 119d for a period of time which allows surface 123 to be reflowed, but which does not allow $T_{circuit}$ to increase by too much. Heat 119a and 119b can be provided for the same amount of time as heat 119c and 119d or it can be provided for another period of time. However, heat 119a and 119b should also be provided so that it reflows surface 112, but does not increase $T_{Circuit}$ by too much. Heat 119a and 119b can affect $T_{Circuit}$ because this heat can be reradiated by region 112 towards circuit 121.

Figure 3B:
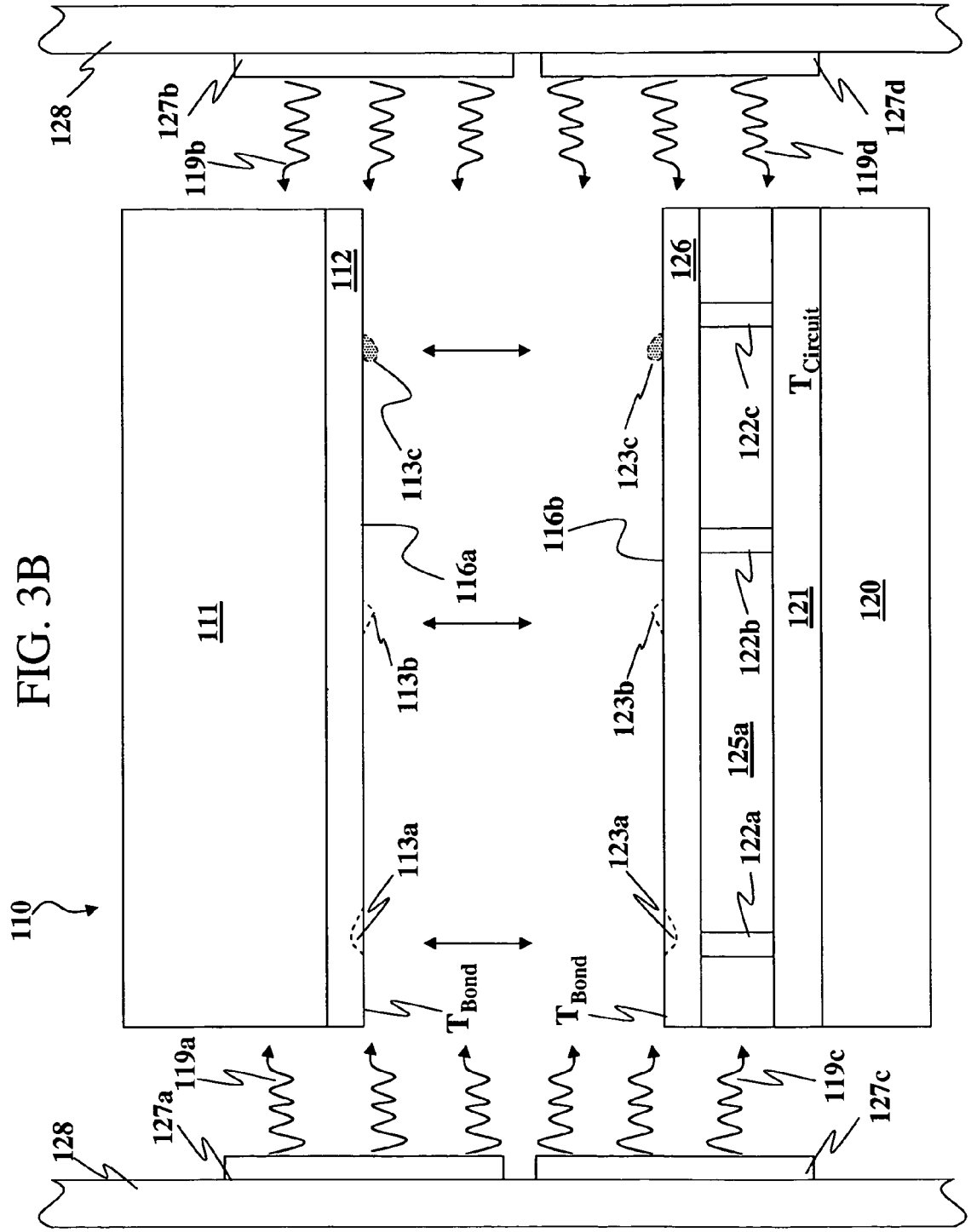

In response to the increase in temperature, surface 123 is reflowed so that material 114b and 114b' of region 126 diffuses into valley 123a and material 115b and 115b' of hillock 123b diffuses away from hillock 123b. Further, particle contamination 123c can desorb from surface 123 as desorption particle 123c' to provide a reflow surface 116b, as shown in FIG. 3B. Valley 123a, hillock 123b, and particle contamination 123c are shown in phantom with dotted lines in FIG. 3B to indicate their location if surface 123 had not been reflowed.

Similarly, in response to the increase in temperature, surface 113 is reflowed so that material 114a and 114a' of region 112 diffuses into valley 113a and material 115a and 115a' of hillock 113b diffuses away from hillock 113b. Further, particle contamination 113c can desorb from surface 113 as desorption particle 113c' to provide a reflow surface 116a, as shown in FIG. 3B. Valleys 113a,123a, hillocks 113b,123b, and particle contamination 113c,123c are shown in phantom with dotted lines in FIG. 3B to indicate their location if surfaces 113 and 123 had not been reflowed. In FIG. 3B, the heat provided by elements 127a-127d is adjusted so that the temperatures of reflowed surfaces 116a and 116b are adjusted to bonding temperature $T_{Bond}$. $T_{Bond}$ can be adjusted by adjusting the energy of the heat outputted by heaters 127a-127d.

Figure 3C:
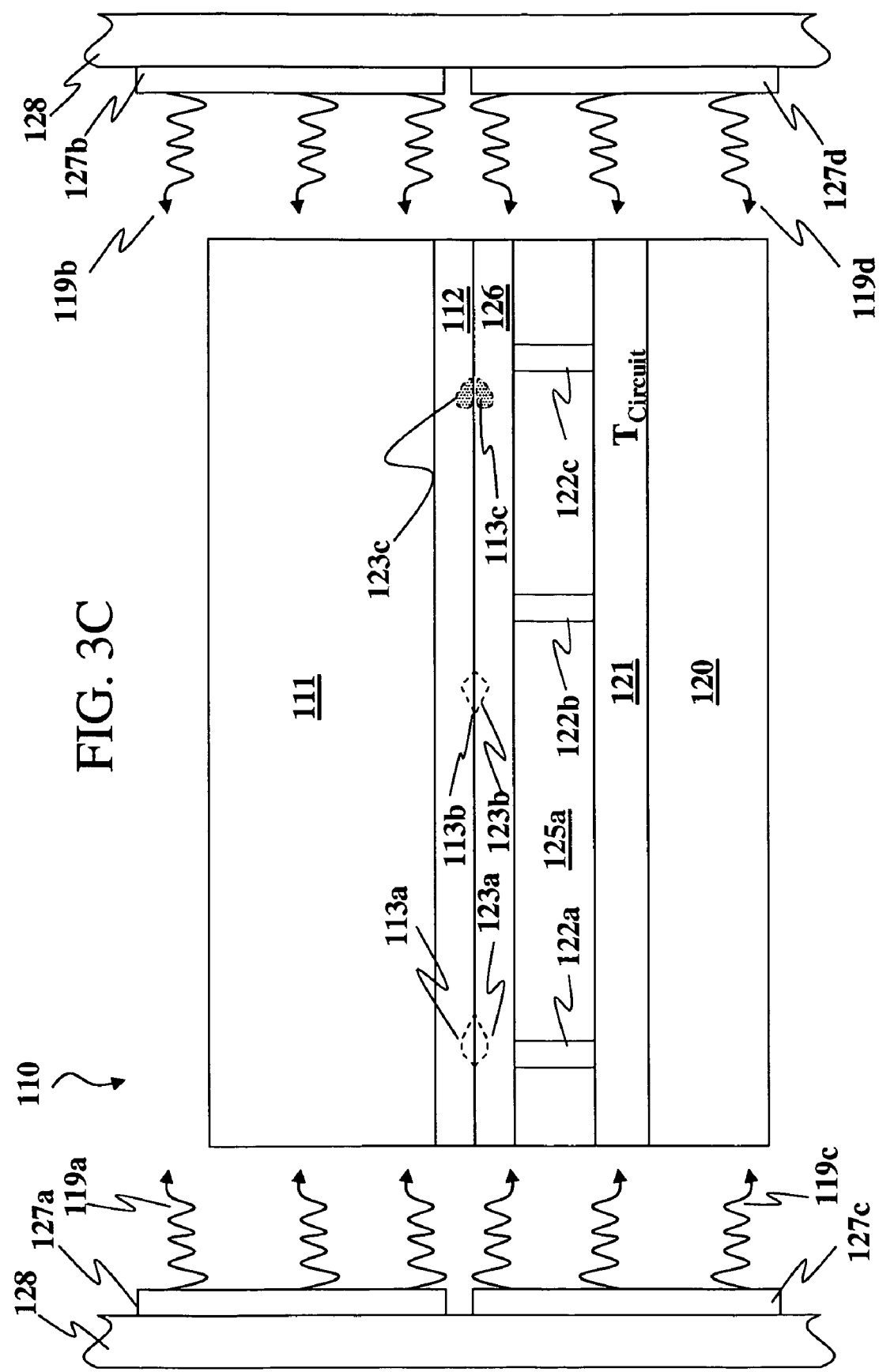

Surfaces 116a and 116b are then positioned adjacent to each other as shown in FIG. 3C. Temperature $T_{Bond}$ should be chosen so that heat 119c and 119d does not increase $T_{Circuit}$ to a temperature which negatively impacts the performance and/or reliability of the devices included in circuit 121. $T_{Bond}$, however, should be high enough so that regions 112 and 126 are bonded together. It should be noted that heaters 127a-127d can provide different amounts of heat with the same or different energies. The amount of heat and its energy outputted by each heater can depend on the material included in regions 112 and 126. If the material included in regions 112 and 126 is the same, then the amount of heat and its energy is typically the same. However, if the material included in regions 112 and 126 is different, then the amount of heat and its energy can be different for each heater or each pair of heaters. For example, heaters 127a and 127b can provide one amount of heat with a particular energy and heaters 127c and 127d can provide a different amount of heat with a different energy.

Figure 3D:
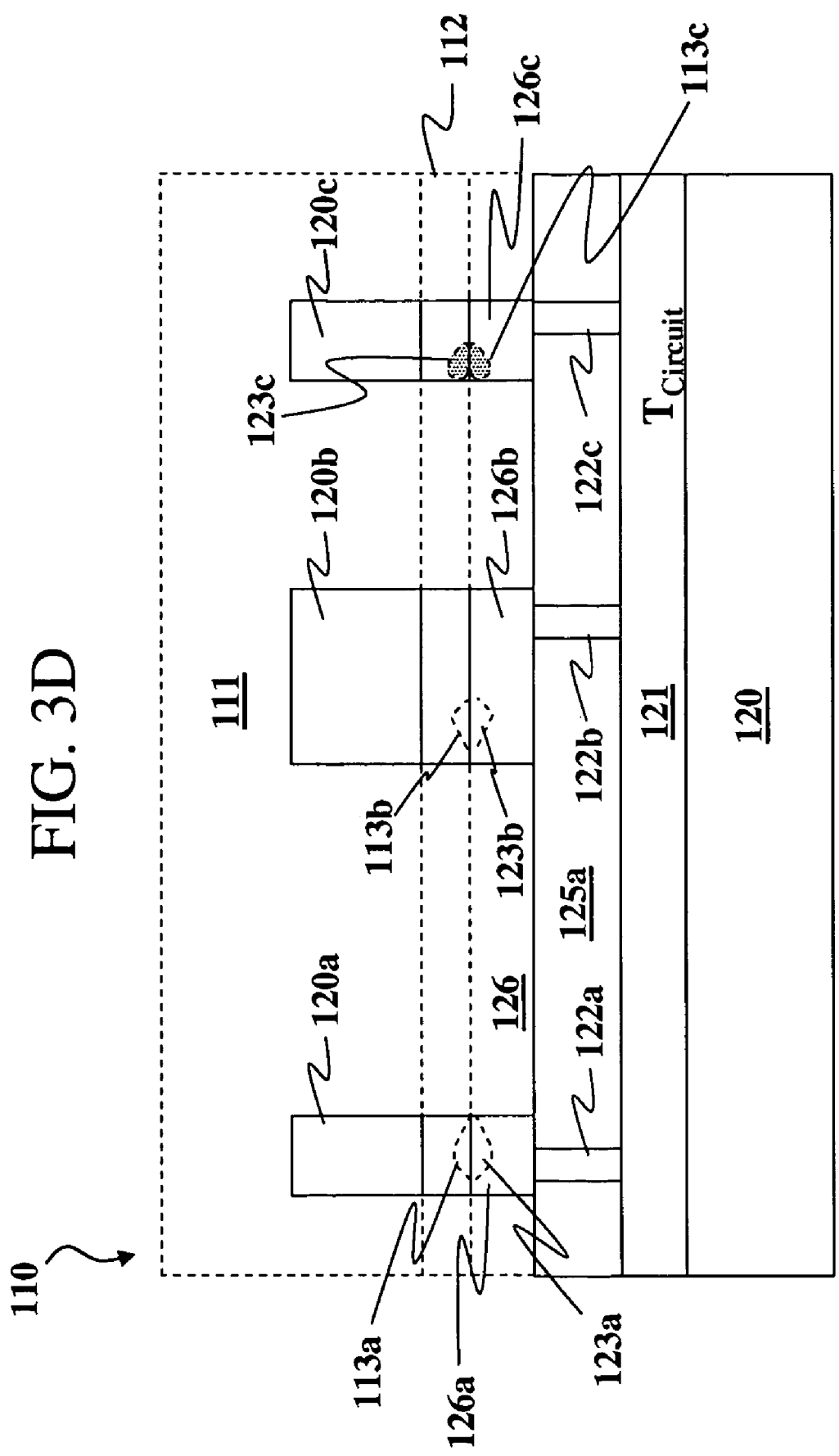

In FIG. 3D, portions of substrate 111 and regions 112 and 126 are removed to form mesa structures 120a, 120b, and 120c. Portions of region 126 that are not removed are conductive regions 126a, 126b, and 126c which are coupled to conductive interconnects 122a, 122b, and 122c, respectively. Portions of region 112 that are not removed are conductive regions 112a, 112b, and 112c which are positioned on regions 126a, 126b, and 126c, respectively. Mesa structures 120a, 120b, and 120c are positioned on regions 112a, 112b, and 112c, respectively.

As can be seen in FIGS. 3C and 3D, if valleys 113a,123a, hillocks 113b,123b and contamination 113c,123c where still present on corresponding surfaces 113 and 123, then regions 112a, 112b, and 112c would be weakly bonded to regions 126a, 126b, and 126c. As a result, mesa structures 120a, 120b, and 120c would also be weakly coupled to respective interconnects 122a, 122b, and 122c. This can negatively affect the yield and reliability of circuit 100, as discussed in more detail above in conjunction with FIGS. 1F and 2F.

FIG. 4a is a flow diagram of a method 200, in accordance with the invention. In this embodiment, method 200 includes a step 201 of providing first and second substrates, and a step 202 of forming a bonding interface between the first and second substrates with a conductive bonding region. Method 200 includes a step 203 of removing a portion of the second substrate. The portion of the second substrate is typically removed after the bonding interface is formed. The second substrate includes a stack of semiconductor material layers. A stack of semiconductor material layers includes two or more semiconductor material layers that are adjacent to each other. The semiconductor material layers can be doped or undoped.

Method 200 can include many other steps. For example, in some embodiments, method 200 includes removing a portion of the conductive bonding region. In some embodiments, method 200 includes forming a vertically oriented semiconductor device. In general, the portion of the conductive bonding region is removed after the portion of the second substrate is removed. Further, in general, the portion of the conductive bonding region is removed after the vertically oriented semiconductor device is formed.

In some embodiments, step 203 of removing the portion of the second substrate includes forming a mesa structure. The mesa structure includes a portion of the stack of semiconductor layers. In these embodiments, method 200 can include removing a portion of the conductive bonding region. In these embodiments, method 200 can include removing a portion of the conductive bonding region so the mesa structure is carried by a contact. In these embodiments, method 200 can include forming a vertically oriented semiconductor device with the mesa structure.

FIG. 4b is a flow diagram of a method 220, in accordance with the invention. In this embodiment, method 220 includes a step 221 of providing first and second substrates, and a step 222 of using a conductive bonding region to form a bonding interface between the first and second substrates. Method 220 includes a step 223 of forming a vertically oriented semiconductor device. The vertically oriented semiconductor device is typically formed after the bonding interface is formed. The vertically oriented semiconductor device includes a stack of semiconductor layers. In some embodiments, the first substrate includes electrical circuitry connected to the vertically oriented semiconductor device through the bonding interface.

Method 220 can include many other steps. For example, in some embodiments, method 220 includes heating the conductive bonding region to reduce its number of defects. Method 220 can include removing a portion of the conductive bonding region after the bonding interface is formed.

Step 223 of forming the vertically oriented semiconductor device typically includes forming a mesa structure. The mesa structure includes a stack of semiconductor layers. In these embodiments, method 220 can include removing a portion of the conductive bonding region so the mesa structure is carried by a contact.

FIG. 4c is a flow diagram of a method 230, in accordance with the invention. In this embodiment, method 230 includes a step 231 of providing an interconnect region and a step 232 of providing a substrate. Method 230 includes a step 233 of forming a bonding interface between the interconnect region and substrate using a conductive bonding region, and a step 234 of processing the substrate to form a mesa structure. The mesa structure is typically formed after the bonding interface is formed. The mesa structure includes a stack of semiconductor layers. In some embodiments, the interconnect region includes a conductive line connected to the mesa structure through the bonding interface.

Method 230 can include many other steps. For example, in some embodiments, method 230 includes removing a portion of the conductive bonding region. In some embodiments, method 230 includes forming a vertically oriented semiconductor device. The vertically oriented semiconductor device includes a portion of the stack of semiconductor layers.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

The invention claimed is:

1. A method, comprising:
providing an interconnect region;
providing a substrate which includes a stack of semiconductor material layers;
forming a bonding interface between the interconnect region and substrate using a conductive bonding region; and
processing the substrate to form a mesa structure.

2. The method of claim 1, further including removing a portion of the conductive bonding region.

3. The method of claim 1, wherein the mesa structure includes a portion of the stack of semiconductor material layers.

4. The method of claim 1, further including forming a vertically oriented semiconductor device which includes a portion of the stack of semiconductor material layers.

5. The method of claim 1, wherein the interconnect region includes a conductive line connected to the mesa structure through the bonding interface.

* * * * *